(12) United States Patent
Ohie

(10) Patent No.: US 6,905,913 B2
(45) Date of Patent: Jun. 14, 2005

(54) SEMICONDUCTOR DEVICE AND METHOD OF MANUFACTURING SAME

(75) Inventor: Mitsuya Ohie, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/893,257

(22) Filed: Jul. 19, 2004

(65) Prior Publication Data

US 2004/0262775 A1 Dec. 30, 2004

Related U.S. Application Data

(62) Division of application No. 10/401,763, filed on Mar. 31, 2003, now Pat. No. 6,777,801, which is a continuation of application No. 09/685,590, filed on Oct. 11, 2000, now Pat. No. 6,580,164.

(30) Foreign Application Priority Data

Mar. 17, 2000 (JP) ........................................ 2000-075833

(51) Int. Cl.⁷ .............................................. H01L 21/44
(52) U.S. Cl. ...................... 438/108; 438/108; 438/109; 257/777; 257/779; 257/778; 257/784; 257/795
(58) Field of Search ................................. 438/108, 109; 257/777, 779, 778, 784, 795

(56) References Cited

U.S. PATENT DOCUMENTS

| | | |
|---|---|---|
| 5,502,289 A | 3/1996 | Takiar et al. |
| 5,805,865 A | 9/1998 | Mimura et al. |
| 5,814,881 A | 9/1998 | Alagaratnam et al. |
| 5,952,725 A | 9/1999 | Ball |
| 6,005,778 A | 12/1999 | Spielberger et al. |
| 6,087,722 A | 7/2000 | Lee et al. |
| 6,133,637 A * | 10/2000 | Hikita et al. ................. 257/777 |
| 6,198,136 B1 | 3/2001 | Voldman et al. |
| 6,208,018 B1 | 3/2001 | Ma et al. |
| 6,215,182 B1 | 4/2001 | Ozawa et al. |
| 6,316,838 B1 | 11/2001 | Ozawa et al. |
| 2002/0017718 A1 | 2/2002 | Hikita et al. |

FOREIGN PATENT DOCUMENTS

| | | |
|---|---|---|
| JP | 61-099362 | 5/1986 |
| JP | 03-116860 | 5/1991 |
| JP | 5267557 | 10/1993 |
| JP | 05-343609 | 12/1993 |
| JP | 6295978 | 10/1994 |
| JP | 738052 | 2/1995 |
| JP | 8288453 | 11/1996 |
| JP | 09-152979 | 6/1997 |
| JP | 2001-015680 | 1/2001 |

* cited by examiner

*Primary Examiner*—David Nelms
*Assistant Examiner*—Mai-Huong Tran
(74) *Attorney, Agent, or Firm*—Volentine Francos & Whitt, PLLC

(57) ABSTRACT

A method of manufacturing a semiconductor device includes providing first pad electrodes for connection to leads and second pad electrodes for an internal interface, over a main surface of a first LSI chip. Third pad electrodes of a second LSI chip and the second pad electrodes of the first LSI chip are respectively electrically connected to one another by wires. Circuits required as for a system LSI, which are not included in the first LSI chip, are placed over the second LSI chip, to implement a desired function used as for a system LSI by the two LSI chips. The plurality of LSI chips are then sealed with a resin.

19 Claims, 13 Drawing Sheets

SEMICONDUCTOR DEVICE AND METHOD OF MANUFACTURING SAME

CROSS REFERENCE TO RELATED APPLICATIONS

This is a divisional application of application Ser. No. 10/401,763, filed Mar. 31, 2003 now U.S. Pat. No. 6,777,801, which is a continuation application of Ser. No. 09/685,590 filed Oct. 11, 2000, now U.S. Pat. No. 6,580,164, which are hereby incorporated by reference in their entirety for all purposes.

BACKGROUND OF THE INVENTION

1. Field of the Invention

The present invention relates to a semiconductor device wherein a plurality of semiconductor elements are sealed with a resin.

2. Description of the Related Art

In general, one has heretofore been known as a semiconductor device, wherein a semiconductor element or chip (hereinafter called "LSI chip") incorporating therein Large Scale Integration (hereinafter called "LSI") in which a plurality of circuits are integrated, is sealed with a resin.

FIG. 16 is a cross-sectional view showing an internal structure of a conventional semiconductor device 1. As shown in FIG. 16, an LSI chip 3 is fixedly placed over a die 8 with an adhesive. A plurality of pad electrodes 5 placed over a main surface of the LSI chip 3 are electrically connected to their corresponding leads 9 each of which serves as a terminal for connection to the outside and is composed of a conductive material, by wires 7 used as metal thin lines or wires. The LSI chip, 3, the pad electrodes 5, the die 8, the wires 7 and parts (corresponding to portions called "inner leads") of the leads 9, which include portions connected to the wires 7 respectively, are sealed with an insulating resin 10. The semiconductor device 1 is electrically connected to another device by parts (corresponding to portions called "outer leads") of the leads 9 having led out of the resin 10, e.g., with a printed wiring board interposed therebetween, whereby the transfer of signals therebetween and the like are carried out.

When the LSI chip 3 is a system LSI for implementing combined functions of a core of a central processing unit (hereinafter called "CPU"), a memory, other circuits used for peripheral functions, etc. as in the case of, for example, a microcomputer (hereinafter called "micon") or the like, these functions are placed over the same semiconductor substrate in mixed form. Therefore, when the system LSI is equipped with a DRAM (Dynamic Random Access Memory) or a batch erasable EEPROM (Electrically Erasable Programmable Read Only Memory), a peculiar manufacturing process is required which is not included in a manufacturing process (hereinafter called "Logic process") for implementing the CPU core and the circuits for the peripheral functions. As a result, a manufacturing process (corresponding to a process for mixing of Logic and memory) peculiar to the system LSI is applied thereto to develop products with a view toward implementing such a system LSI.

A semiconductor device in which a plurality of LSI chips are sealed with a resin to bring it to the commercial stage (i.e., a plurality of semiconductor elements are stored or held in one package), has appeared in recent years. Such a semiconductor device is referred to as "MCP (Multiple Chip Package) type". The semiconductor device of the MCP type is applied to a memory-system LSI. The semiconductor device is applied to, for example, a case in which memories identical in type are held or accommodated in one package to implement an increase in memory capacity, or a case in which memories of types different in function from one another are held in one package to thereby implement space saving.

FIG. 17 is a cross-sectional view showing an internal structure of an MCP type semiconductor device 11. FIG. 18 is a plan view illustrating the internal structure of the MCP type semiconductor device 11. In FIGS. 17 and 18, elements of structure structurally similar to those shown in FIG. 16 are identified by the same reference numerals.

As shown in FIGS. 17 and 18, an LSI chip 3 fixedly disposed with an adhesive is placed on a die 8. A plurality of pad electrodes 5 respectively electrically connected to leads 9 by wires 7 are placed over a main surface of the LSI chip 3. Further, an LSI chip 13 is fixedly placed over the main surface of the LSI chip 3 with an insulative adhesive interposed therebetween. A plurality of pad electrodes 15 are disposed over a main surface of the LSI chip 13. These pad electrodes 15 are electrically connected to their corresponding ones of the leads 9 by wires 17. These two LSI chips 3 and 13, parts of the leads 9, which include portions where they are respectively connected to the wires 7 and 17, and the die 8 are sealed with a resin 10.

Thus, the MCP type semiconductor device 11 is configured so as to accommodate or hold a plurality of the LSI chips 3 and 13 in one package and have the leads 9 for connection to the outsides of the LSI chips 3 and 13.

As such an MCP-compatible semiconductor device 11, there is known one like BGA (Ball Grid Array), for example. This has such a structure that different types of memories such as a SRAM (Static Random Access Memory), a batch erasable EEPROM, etc. are held or stored in one package, and input/output terminals of the memories are respectively individually connected to the leads 9 to independently activate the memories respectively. Owing to such a structure, the functions corresponding to the two LSI chips can be implemented by a space for one LSI chip.

Thus, in the LSI, particularly, the system LSI built in the semiconductor device, a mixed process is applied thereto to develop products. In the memory-system LSI, the MCP type semiconductor device is applied to implement an increase in memory capacity and bring different memories into combined form, thereby developing each product.

However, the semiconductor device equipped with the system LSI has the following problems in that it is manufactured over the same semiconductor substrate according to a specific process obtained by integrating a manufacturing process peculiar to each memory into a Logic process.

A first problem is that since the number of masks increases compared with a Logic-single manufacturing process or a memory-single manufacturing process, a reduction in yield occurs. A second problem is that the specific process no allows the facilitation of an improvement in the performance of a circuit for a Logic unit and an improvement in the performance of a memory unit. A third problem is that since the manufacturing process becomes complex, TAT becomes long. A fourth problem is that since the manufacturing process is complicated and the number of masks increases, process costs are raised. A fifth problem is that the development itself of a process used for LSI obtained by mixing an LSI comprising an SOI (Silicon On Insulator) process which purses a low voltage/low current operation and an LSI comprising a special process for fabricating high-withstand elementary devices (high-withstand MOS transistors, etc.) together is so difficult from a technical viewpoint.

In an LSI to which a finer deep sub-micron manufacturing process is applied, a reduction in voltage (about 0.8V to 1.5V) is accelerated even in a Logic process from now on in particular. Thus, a plurality of voltages including a high voltage (e.g., 8V to 12V) higher than a source voltage (e.g., 3.3V or 5V) are required upon rewriting and reading of data as in the case of the batch erasable EEPROM. It is therefore difficult to implement a system LSI (such as a batch erasable memory-equipped micon or the like) configured by integrating a high-withstand process for building high-withstand elementary devices therein and the Logic process therein.

Since the MCP type semiconductor device aims to increase the capacity of each memory and provide space saving as described above, limitations are imposed on the provision of leads for each individual LSIs to accommodate or hold the same types of memory system LSIs in one package or hold different types of memory system LSIs in one package and independently operate the different types of memory system LSIs respectively. Therefore, nothing was found to implement the system LSI for the MCP type semiconductor device.

The present invention aims to solve the above problems and make it possible to easily implement a system LSI by a semiconductor device wherein a plurality of LSI chips are sealed with a resin.

Further, the present invention aims to solve problems developed upon implementation of a system LSI by a semiconductor device wherein a plurality of LSI chips are sealed with a resin, and implement the system LSI without impairing a function defined as for the system LSI as compared with the prior art.

SUMMARY OF THE INVENTION

The present invention has been made to solve the foregoing problems and provides, as a means, a semiconductor device wherein a first semiconductor element and a second semiconductor element are sealed with a resin, comprising a plurality of first pad electrodes which are placed over a main surface of the first semiconductor element and which are respectively electrically connected to any of a plurality of circuits provided over the first semiconductor element and electrically connected to their corresponding plural terminals used for connection to the outside, a plurality of second pad electrodes placed over the main surface of the first semiconductor element and respectively electrically connected to any of the plural circuits provided over the first semiconductor element, and a plurality of third pad electrodes which are placed over a main surface of the second semiconductor element and which are respectively electrically connected to circuits provided over the second semiconductor element and electrically connected to their corresponding second pad electrodes, and wherein the first semiconductor element executes a predetermined function by using the circuits provided over the second semiconductor element.

In the semiconductor device of the present invention owing to such a configuration, the second pad electrodes and the third pad electrodes are electrically connected to one another to allow the transfer of signals between the circuits provided over the first semiconductor element and the circuits provided over the second semiconductor element. These two semiconductor elements are capable of implementing one function provided as for a system LSI.

Therefore, the first semiconductor element and the second semiconductor element can be manufactured individually, thus making it possible to solve the above problems.

In the present invention as well, contrivances such as the placement or layout of the second pad electrodes, the supply of a source voltage or a ground voltage employed in the second semiconductor element, the placement of means for selecting whether the circuits provided within the second semiconductor element should be used, etc. make it possible to solve even problems developed upon implementation of a system LSI by an MCP type semiconductor device.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 7 is a diagram showing a circuit of an LSI chip 203 connected to a pad electrode 205a;

FIG. 19 is a diagram showing a modification of a circuit for an LSI chip 203, which is connected to a pad electrode 205a;

DESCRIPTION OF THE PREFFERED EMBODIMENTS

Figure 1:
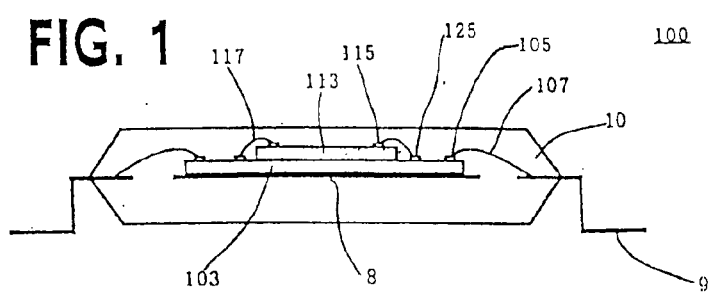
FIG. 1 is a cross-sectional view showing an internal structure of an MCP type semiconductor device 100 according to a first embodiment of the present invention.
Figure 2:
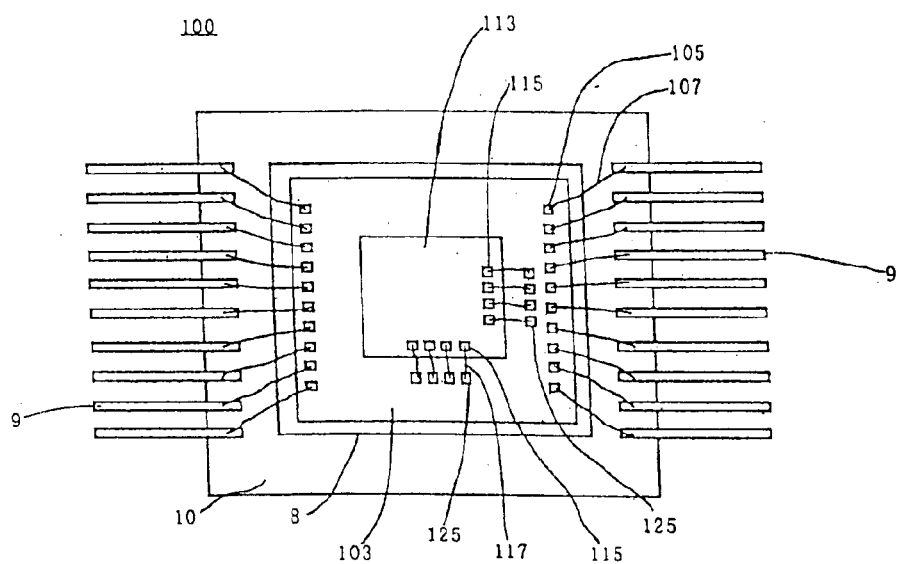
FIG. 2 is a plan view illustrating the internal structure of the MCP type semiconductor device 100 according to the first embodiment of the present invention.
Figure 16:
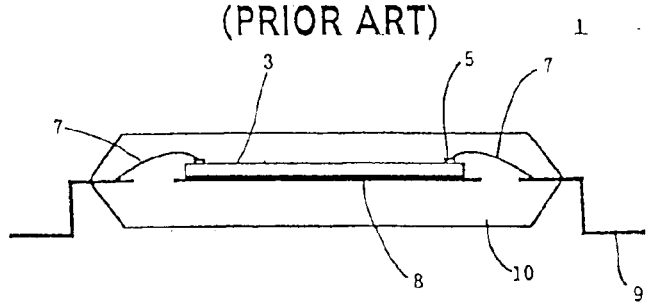
FIG. 16 is a cross-sectional view showing a conventional semiconductor device.
Figure 17:
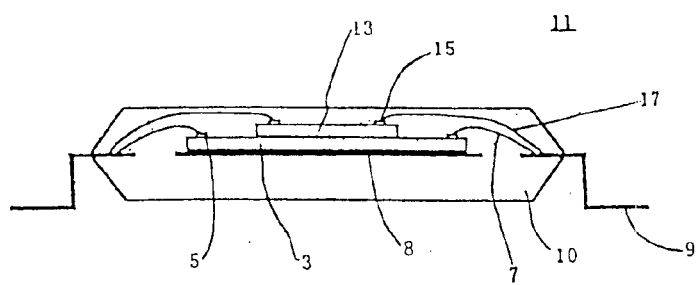
FIG. 17 is a cross-sectional view illustrating another conventional semiconductor device.
Figure 18:
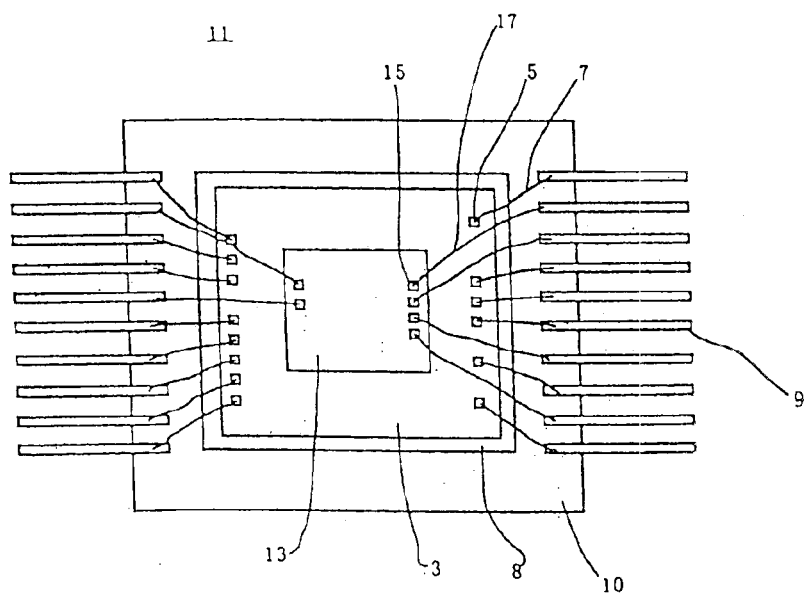
FIG. 18 is a plan view depicting the semiconductor device shown in FIG. 17.

Semiconductor devices of the present invention will hereinafter be described in detail with reference to the accompanying drawings. FIG. 1 is a cross-sectional view showing an internal structure of an MCP type semiconductor device 100 according to a first embodiment of the present invention, and FIG. 2 is a plan view illustrating the internal structure of the semiconductor device 100, respectively. In FIG. 1, the same elements of structure as those shown in FIGS. 16 through 18 are identified by the same reference numerals.

In FIGS. 1 and 2, the semiconductor device 100 has an LSI chip 103 which serves as a first semiconductor element, and an LSI chip 113 which serves as a second semiconductor element. The LSI chip 103 and the LSI chip 113 are both similar in shape to each other (rectangular in the present invention).

The LSI chip 103 is fixed and placed on a substantially central area of a die 8 with an adhesive provided between the reverse side or back of the LSI chip 103 and the die 8. A plurality of first pad electrodes 105 are placed over a main surface of the LSI chip 103. In the first embodiment, the respective pad electrodes 105 are respectively placed in line along the two parallel sides of the LSI chip 103.

Further, a plurality of second pad electrodes 125 are placed over the main surface of the LSI chip 103. The respective pad electrodes 125 are disposed at arbitrary positions around an area where the LSI chip 113 is placed.

The LSI chip 113 smaller than the LSI chip 103 in size is fixed and placed on a substantially central area of the LSI chip 103 with an adhesive provided between the back of the LSI chip 113 and the main surface of the LSI chip 103. Incidentally, the main surface of the LSI chip 103 may desirably be comprised of an insulating protective film to avoid a needless electrical connection to the LSI chip 113. A plurality of third pad electrodes 115 are placed over the main surface of the LSI chip 113. In the first embodiment, the pad electrodes 115 are respectively placed in line along the two sides (corresponding to the sides along which the second pad electrodes 125 are arranged) of the LSI chip 113.

The plurality of first pad electrodes 105 are electrically connected to their corresponding leads 9 through wires 107. Each of the plurality of second pad electrodes 125 is electrically connected to any of the plurality of third pad electrodes 115 corresponding thereto through a wire 117.

The LSI chips 103 and 113, the die 8, the wires 107 and 117, and some of the leads 9, which include portions thereof connected to the wires 107, are sealed with a resin 10.

Figure 3:
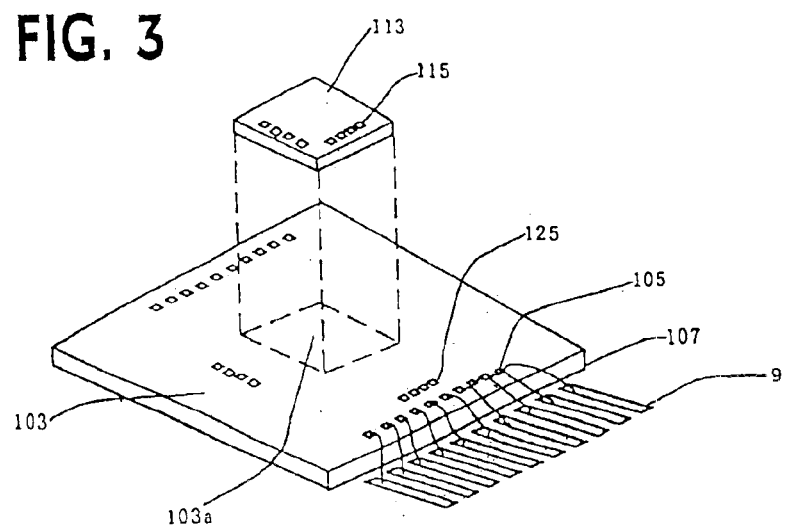
FIG. 3 is a perspective view for describing the assembly of the semiconductor device 100 shown in FIG. 1.

FIG. 3 is a perspective view for describing the assembly of the semiconductor device shown in FIG. 1. Incidentally, some of the leads 9 and wires 107 are omitted from FIG. 3 because FIG. 3 is used for the description of its assembly. As shown in FIG. 3, an LSI chip 103 having first pad electrodes 105 and second pad electrodes 125 is first prepared. Upon the manufacture of the LSI chip 103 at this time, the pad electrodes 125 are configured so as to be placed around an area 103a on a main surface on which the LSI chip 113 is to be placed subsequently. Further, the LSI chip 113 is additionally manufactured and prepared independently of the manufacture of the LSI chip 103. At this time, the placement or layout of pad electrodes 115 may be set according to positions to place the pad electrodes 125 thereat in order to make wire bonding to be executed subsequently easier and avoid a short circuit or the like developed between wires. The layout of the pad electrodes 125 on the LSI chip 103 and the layout of the pad electrodes 115 on the LSI chip 113 can be handled as follows: If either one of both the pad electrodes is determined in advance upon design of a circuit layout used for the LSI chip with either one of the pad electrodes placed thereon, the LSI chip with the other pad electrodes placed thereon can also cope with their placement with ease.

The first pad electrodes 105 of the LSI chip 103 and the leads 9 are respectively electrically connected to one another by the wires 107. Afterwards, the LSI chip 113 is placed over the area 103a to be located in place, on the main surface of the LSI chip 103. Thereafter, the pad electrodes 115 and the pad electrodes 125 are electrically connected to one another by wire bonding. Incidentally, a method of manufacturing the semiconductor device is not limited to it. Before the first pad electrodes 105 of the LSI chip 103 and the leads 9 are electrically connected to one another by the wires 107 respectively, the LSI chip 113 is placed over the area 103a to be located in place on the main surface of the LSI chip 103. Thereafter, the electrical connections between the first pad electrodes 105 and the leads 9 by the wires 107 and the electrical connections between the pad electrodes 115 and the pad electrodes 125 by the wires 117 may be performed. The latter can be expected to become efficient because a wire bonding process can collectively carried out.

Thus, the semiconductor device according to the first embodiment is one wherein the LSI chips 103 and 113 are singly developed respectively and the transfer of signals between these two LSI chips is performed using the pad electrodes 125 provided over the LSI chip 103 after the fabrication of the LSI chips, whereby one function (corresponding to a function used as a system LSI) is implemented.

Figure 4:
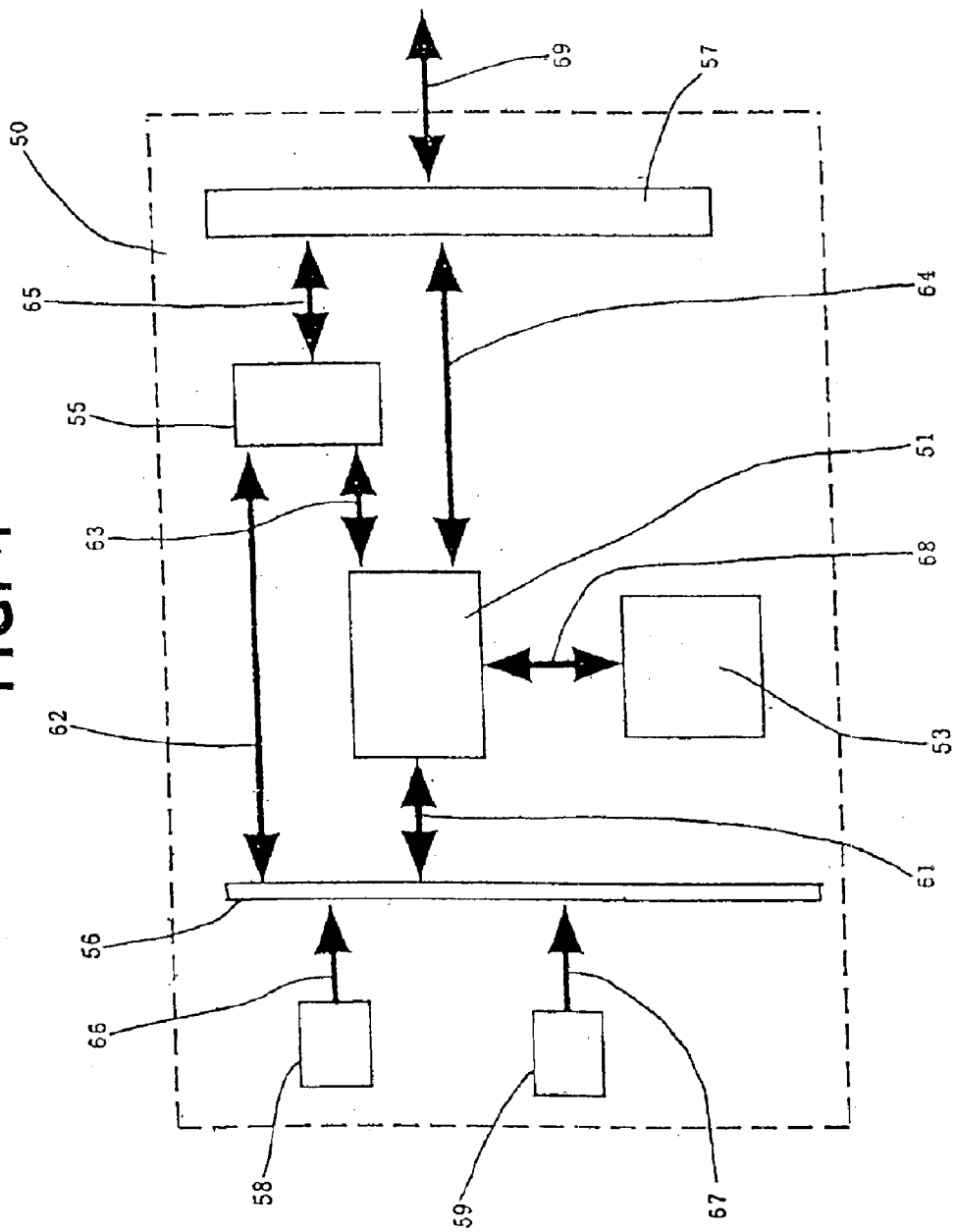
FIG. 4 is a block diagram showing a configuration of a micon 50 equipped with a batch erasable EEPROM.

A typical example of the system LSI applied to the semiconductor device of the present invention will be explained using a micon equipped with a batch erasable EEPROM. FIG. 4 is a block diagram showing a configuration of a micon 50 equipped with a batch erasable EEPROM.

As shown in FIG. 4, the micon 50 comprises various components such as peripheral functions such as a CPU 51, a timer 58, a serial-parallel converter 59, etc., an SRAM 55 used to hold data therein and transmit it therefrom, a batch erasable EEPRROM 53 used as a programmable memory with various instructions stored therein, an input/output interface 57, etc.

These respective components are connected to one another so as to be capable of performing the transfer of signals therebetween through the use of a number of signal lines and buses. A common bus 56 is used to transfer a signal outputted from the timer 58 through a signal line 66 and transfer a signal outputted from the serial-parallel converter through a signal line 67. Further, the common bus 56 is used to swap data with the CPU 51 through a signal line 61 and swap addresses and data with the SRAM 55 through a signal line 62, for example. A signal line 63 transmits control signals such as a write instruction signal, etc. outputted from the CPU 51 to the SRAM 55. The input/output interface 57 is used to transfer data received from outside through a signal line 69 to the CPU 51 through a signal line 64. The signal line 64 is used to transfer the control signals sent from the CPU 51 to the input/output interface 57. A signal line 65 is used to transfer data read from the SRAM 55 to the input/output interface 57 and receive a signal sent from the input/output interface 57. The input/output interface 57 performs swapping of signals such as data with the outside through the signal line 69.

The EEPROM 53 sends programs such as instructions stored therein to the CPU 51 through the use of a signal line 68. Further, the EEPROM 53 selects a desired program according to each address sent from the CPU 51 through the signal line 68. Namely, the signal line 68 comprises plural signal lines such as an address bus, a data bus, a memory control signal line, a source voltage supply line for the EEPROM 53, etc.

In the semiconductor device 100 according to the first embodiment of the present invention, the LSI chip 113 is defined as a memory system LSI equipped with the EEPROM 53 shown in FIG. 4, whereas the LSI chip 103 is defined as a Logic system LSI loaded with other components shown in FIG. 4 except for the EEPROM 53.

Therefore, the plurality of pad electrodes 115 of the LSI chip 113 and the plurality of pad electrodes 125 of the LSI chip 103 are respectively used to perform signal swapping similar to the signal line 68 shown in FIG. 4. In other words, the plurality of pad electrodes 115 of the LSI chip 113 and the plurality of pad electrodes 125 of the LSI chip 103 are electrically connected to one another by the wires 117 to thereby make it possible to implement the signal swapping similar to the signal line 68.

As described above, the second pad electrodes 125 provided over the LSI chip 103 serve as electrode pads used to interface with the LSI chip 113. The pad electrodes 125 are used to allow the swapping of signals with the LSI chip 113, thereby making it possible to activate the system LSI or LSI chip as the micon equipped with the batch erasable EEPROM. Further, any new restrictions are not imposed on the number of the conventional leads and their placement and hence the leads 9 may be handled in a manner similar to the prior art.

In the first embodiment of the present invention, the two LSI chips of the LSI chip 103 and the LSI chip 113 held in one package are used to thereby allow them to operate as one micon. Therefore, the semiconductor device according to the first embodiment of the present invention can obtain the following advantageous effects.

Since the LSI chip 103 used as the first semiconductor element and the LSI chip 113 used as the second semiconductor element can respectively be manufactured individually, the respective LSI chip can be manufactured in parallel. Thus, TAT for development and manufacture can be shortened.

Since the LSI chip 103 can be manufactured in the Logic process and the LSI chip 113 can be fabricated in a process peculiar to a memory, respectively, it is not necessary to develop a mixed process obtained by a combination of the Logic process and the memory process. In particular, an LSI comprised of an LSI-peculiar high-withstand process which needs high-withstand elementary devices as in the batch erasable EEPROM, and an LSI comprised of an SOI process can also be utilized in combination, thereby making it possible to implement the development of a system LSI having a more advanced function.

The semiconductor device is implemented by a laminated layer of the LSI chips, and the layout and the number of the leads 9 may be handled in a manner similar to the LSI chip 103 used as one semiconductor element. It is therefore unnecessary to increase a size used as for the semiconductor device and additionally develop a lead frame. A semiconductor device manufactured in the conventional mixed process can be applied as it is.

Upon bringing a micon to the commercial stage, a form having a product (hereinafter called "mask ROM version micon") using a mask ROM in which software (program) is fixed as a program memory, and a product (hereinafter called "EEPROM version micon") using a software-changeable EEPROM even after the program memory is built in LSI, is common upon implementation of the same function where a circuit portion corresponding to hardware like a CPU or a DSP (Digital Signal Processor) and a program memory corresponding to software are mixed together to implement one function. In addition to the above, there are known one wherein an EPROM is provided for software and a package is provided with a window for ultraviolet radiation, an OTP (One Time Programming) version micon which allows program writing only once without providing the window, etc.

In general, the EEPROM version micon is capable of performing writing of data into an EEPROM, i.e., rewriting of software, etc. even after the EEPROM is incorporated into an LSI as a program memory. Therefore, the EEPROM version micon is applied to obtain the following advantageous effect.

The first is to make it possible to develop and debug software immediately before the shipment of micon's products. The second is to make it possible to cope with the occurrence of a soft bug and meet an improvement (version-up or the like) in product because it is possible to rewrite software even after the shipment of micon's products.

Namely, the EEPROM version micon is used for product development intended for a new field, which is predicated on the rewriting of programs, with a view toward performing the shortening of TAT for product development, an improvement in function, etc.

Since, however, a voltage higher than a source voltage is used for the writing of data, etc., the EEPROM version micon needs a special manufacturing process and tends to increase in manufacturing cost.

On the other hand, although there is a small difference according to the type of mask ROMs to be placed, the mask ROM version micon can be manufactured by using masks used in a common Logic process, such as a metal layer, a contact layer, an implanted layer, etc. and fabricating a fixed program code mask. Therefore, since the mask ROM version micon no requires the special manufacturing process, the manufacturing cost thereof can be brought to a low cost (about ½ to ⅓ the manufacturing cost of the EEPROM version micon).

Since there is a difference in manufacturing cost in this way, the EEPROM version micon and the mask ROM version micon are commonly applied as follows:

Upon development of each micon's product, the EEPROM version micon is first used to allow the rewriting of a program. Hardware and software are debugged in a state in which the rewriting of the program has been made possible.

Immediately after the commencement of the mass production of micon's products, the EEPROM version micon is applied as for mass production. This is carried out to allow the handling of program bugs apt to occur in case of emergency.

Market track records (such as the situation with regard to the occurrence of program bugs, etc.) are confirmed after the shipment of each product as the EEPROM version micon, and the EEPROM version micon is changed to a mask ROM version micon capable of implementing the same function under stable conditions.

Thus, the EEPROM version micon is applied upon development and initial mass-production shipment. Therefore, if consideration is given to the number of life-cycle shipments of such types of micons, then the mask ROM version micon rather than the EEPROM version micon predominates.

Therefore, when the development of micons each having a new function is taken into consideration, the development of the EEPROM version micon reduced in mass-production number must also be carried out together with the development of the mask ROM version micon. Thus, when the micons having the new functions are released, TAT, the number of man-hours, and the cost of development increase respectively. In particular, the EEPROM version micon reduced in mass-production number is deteriorated in investment efficiency.

Since the EEPROM version micon and the mask ROM version micon need the implementation of the same function, the EEPROM version micon must realize various characteristics equivalent to those of the mask ROM version micon which takes a final form. The various characteristics include current consumption, latch-up characteristics, noise characteristics, etc. as well as electrical characteristics and functions. If substantially the same various characteristics are not obtained from the EEPROM version micon and the mask ROM version micon, then a problem arises in that a difference occurs in EMC specs. A problem arises in that when the EEPROM version micon is replaced by the mask ROM version micon, for example, an operating margin thereof increases, noise increases, a re-adjustment thereof is required because the accuracy of an analog circuit built in the micon varies, the amount of current consumption changes, and the lifetime of a battery changes.

Figure 5:
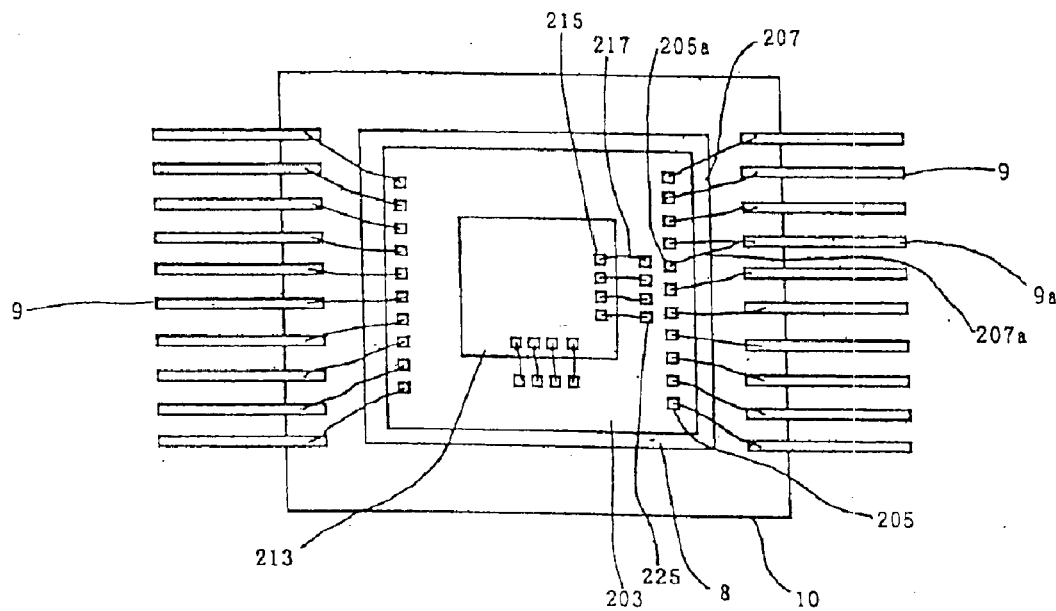
FIG. 5 is a plan view illustrating an internal structure of an MCP type semiconductor device according to a second embodiment of the present invention, and is a view of the semiconductor device used as an EEPROM version micon.
Figure 6:
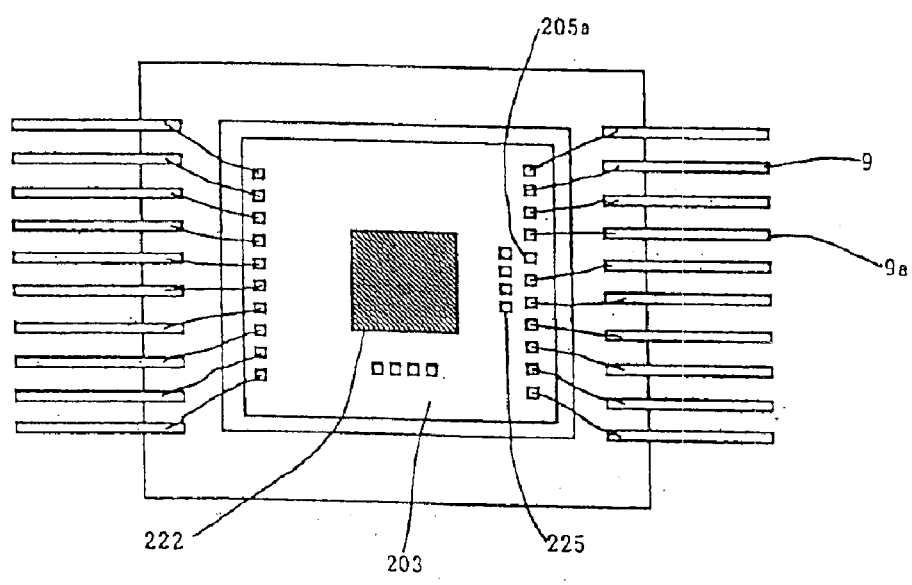
FIG. 6 is a plan view depicting the internal structure of the MCP type semiconductor device according to the second embodiment of the present invention and is a view of the semiconductor device used as a mask ROM version micon.

A second embodiment provides one to which the semiconductor device according to the first embodiment of the present invention is applied, and which is improved so as to solve the above-described problems which arise between the EEPROM version micon and the mask ROM version micon. A semiconductor device according to the second embodiment of the present invention will be described below with reference to the drawings. FIGS. 5 and 6 are respectively plan views of the semiconductor device according to the second embodiment of the present invention. FIG. 5 is a view showing the semiconductor device used as an EEPROM version micon, and FIG. 6 is a view showing the semiconductor device used as a mask ROM version micon, respectively. FIGS. 5 and 6 correspond to FIG. 2. The same elements of structure as those shown in FIG. 2 are identified by the same reference numerals.

In FIG. 5, an EEPROM defined as a program memory is placed over an LSI chip 213. An LSI chip 203 having a main surface on which the LSI chip 213 is placed, is equipped with a mask ROM defined as a program memory and with all of circuits required as for a micon other than the program memory.

A plurality of pad electrodes 225 placed over the main surface of the LSI chip 203 are electrically connected to their corresponding ones of a plurality of pad electrodes 215 placed over a main surface of the LSI chip 213 by wires 217. Further, a plurality of leads 9 are electrically connected to their corresponding ones of a plurality of pad electrodes 205 by wires 207.

In the LSI chip 203, a selecting pad electrode 205a is provided as one of the first pad electrodes 205. In the EEPROM version micon shown in FIG. 5, the pad electrode 205a is electrically connected to its corresponding lead 9a for a source voltage by a wire 207a. The lead 9a for the source voltage is also connected to its corresponding pad electrode 205 for the source voltage.

The mask ROM version micon shown in FIG. 6 does not have the LSI chip 213. Therefore, any of the pad electrodes 225 are not subjected to wire bonding. The LSI chip 203 is equipped with a mask ROM 222. Further, the pad electrode 205a is not wire-bonded to its corresponding lead 9a for the source voltage.

Figure 7:
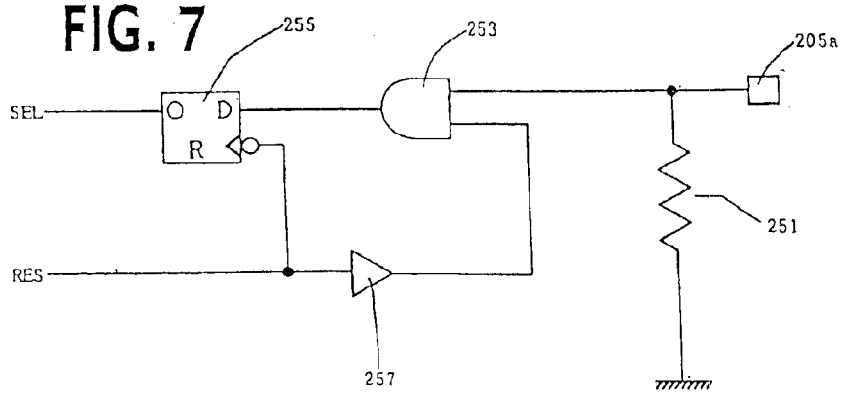

A description will now be made of the relationship between the pad electrode 205a of the LSI chip 203 and a circuit placed inside the LSI chip 203. FIG. 7 is a view showing the circuit in the LSI chip 203, which is connected to its corresponding pad electrode 205a.

In FIG. 7, the pad electrode 205a is electrically connected to a grounded pull-down resistor 251 and electrically connected to one input terminal of an AND gate 253. A reset signal RES for initialization of the micon is inputted to the other input terminal of the AND gate 253 through a delay buffer 257. An output terminal of the AND gate 253 is electrically connected to an input terminal D of a latch circuit (hereinafter called "LAT") 255. The reset signal RES is inputted to a clock terminal of the LAT 255. A signal outputted from the LAT 255 is inputted to an internal circuit to be described later as a select signal SEL. Incidentally, a flip-flop may be used as the LAT 255 in FIG. 7. Incidentally, the AND gate 253 may not be provided. However, the AND gate 253 may preferably be provided to stabilize the potential level of a signal inputted to the input terminal D of the LAT 255. If, for example, an analog switch whose conduction is controlled based on the reset signal RES, is to receive the signal inputted through the input terminal D inside the LAT 255, it is then unnecessary to provide the AND gate 253. If the signal inputted from the input terminal D is to be received by an inverter inside the LAT 255, then the AND gate 253 may preferably be provided because the state of operation of the inverter can reliably be stabilized.

The operation of the circuit shown in FIG. 7 will be described. Now consider where the pad electrode 205a is electrically connected to its corresponding lead 9a for the source voltage by wire bonding as shown in FIG. 5. Therefore, a signal having a source potential level (hereinafter called "H level") is inputted to one input terminal of the AND gate 253. Upon initialization of a micon, the reset signal RES changes from a ground potential level (hereinafter called "L level") to the H level. At this time, the potential level of a signal outputted from the AND gate 253 is brought to the H level. Afterwards, the potential level of the reset signal RES changes from the H level to the L level with deinitialization of the micon. The LAT 255 captures or takes in a signal received at the input terminal D in response to the falling edge of the reset signal RES (H through-L latch type). Owing to the provision of the buffer 257, the potential level of the signal captured by the LAT 255 results in one set according to a potential level at the pad electrode 205a. As a result, the potential level of the select signal SEL corresponding to an output signal of the LAT 255 is brought to the H level.

Let's also assume that the pad electrode 205a is electrically disconnected from the leads 9a for the source voltage by wire bonding as shown in FIG. 6. Therefore, the level of the potential applied to one input terminal of the AND gate 253 is brought to the L level by the pull-down resistor 251. Thereafter, the potential level of the reset signal RES changes from the L level to the H level in the same manner as described above. In response to the change of the reset signal RES to the L level again, the LAT 255 captures a signal received at the input terminal D. As a result, the potential level of a select signal SEL corresponding to an output signal of the LAT 255 is brought to the L level.

Thus, the potential level of the select signal SEL can be selected according to whether the pad electrode 205a is connected to the lead 9a by wire bonding.

Figure 8:
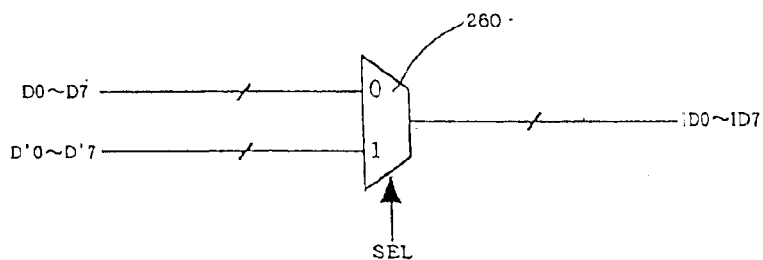
FIG. 8 is a conceptional diagram of a selector circuit 260 to which a select signal SEL is inputted.
Figure 9:
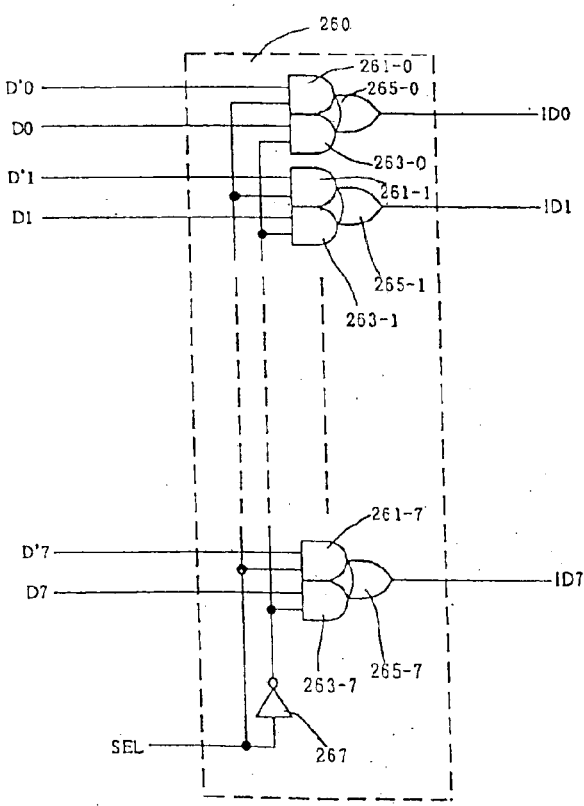
FIG. 9 is a specific circuit diagram of the selector circuit 260.

A description will next be made of the circuit lying within the LSI chip 203, to which the select signal SEL is inputted. FIG. 8 is a view showing the concept of a selection circuit 260 to which the select signal SEL is inputted, and FIG. 9 is a specific circuit diagram of the selection circuit 260, respectively. Incidentally, FIGS. 8 and 9 respectively show an example in which the EEPROM placed on the LSI chip 213 and the mask ROM placed on the LSI chip 203 handle 8-bit data.

In FIG. 8, data D0 through D7 sent from the EEPROM placed on the LSI chip 213 are inputted to one input terminal (0 side input) of the selection circuit 260. Further, data D'0 through D'7 sent from the mask ROM placed on the LSI chip 203 are inputted to one input terminal (1 side input) of the selection circuit 260. While the numbers of signal lines for transferring the data D0 through D7 and the data D'0 through D'7 are respectively shown as one in FIG. 8, 8-bit data are transferred in parallel by eight signal lines. The select signal SEL is inputted to the selection circuit 260. When the potential level of the select signal SEL is of an L level, signals ID0 through ID7 outputted from the selection circuit 260 result in signals set according to the data D0 through D7 respectively. When the potential level of the select signal SEL is of an H level, data ID0 through ID7 outputted from the selection circuit 260 result in signals set according to the data D'0 through D'7 respectively.

The above operation will be explained using a specific circuit diagram of the selection circuit 260, which is shown in FIG. 9. The selection circuit 260 comprises sixteen two-input one-output AND gates 261-0 through 261-7 and 263-0 through 263-7, eight two-input one-output OR gates 265-0 through 265-7, and one inverter 267. Data D'n is inputted to one input terminal of the AND gate 261-n (where n: integers of 0 to 7). A select signal SEL is inputted to the other input terminal of the AND gate 261-n. Data Dn is inputted to one input terminal of the AND gate 263-n. A signal outputted from the inverter 267 supplied with the select signal SEL is inputted to the other input terminal of the AND gate 263-n. A signal outputted from the AND gate 261-n and a signal outputted from the AND gate 263-n are respectively inputted to two input terminals of the OR gate 265-n.

As is understood from the configuration of the selection circuit 260 shown in FIG. 9, when the potential level of the select signal SEL is L in level, the AND gates 263-n to which a signal whose potential level is H in level, is inputted from the inverter 267, become effective or valid. As a result, data D0 through D7 are respectively outputted as output data ID0 through ID7 through the AND gates 263-n and OR gates 265-n. When the potential level of the select signal SEL is of the H level, the AND gates 261-n to which the select signal SEL whose potential level is of the H level, is inputted, becomes effective, so that data D'0 through D'7 are respectively outputted as output data ID0 through ID7 through the AND gates 261-n and OR gates 265-n. The output data ID0 through ID7 are transferred to an internal bus provided inside the LSI chip 203 so as to be capable of being transferred to another circuit placed within the LSI chip 203.

Thus, if the potential level of the select signal SEL is of the L level, then the mask ROM placed over the LSI chip 203 can selectively be used. If the potential level of the select signal SEL is of the H level, then the EEPROM placed on the LSI chip 213 can selectively be used. Incidentally, FIGS. 8 and 9 respectively show only the selection or switching of a data bus section for performing the transfer of data by way of example. However, it is necessary to allow a selection in a manner similar even to other control signals required to access each of memories (mask ROM and EEPROM) in practice. The batch erasable EEPROM needs a special bus for the writing of data as a distinction from the mask ROM. On the other hand, when the LSI chip 213 is selected, the LSI chip 203 is provided with a bus used only upon writing of data into the EEPROM of the LSI chip. Alternatively, the signal lines for transferring the data D'0 through D'7 and the signal lines for transferring the ID0 through ID7, etc. all of which are shown in FIGS. 8 and 9, are set as bidirectional buses. In this condition, the configuration of the selection circuit 260 can be implemented by handling such as the setting of it as analog switch other than the AND and OR gates.

Thus, switching can be performed between an MCP mode for using the LSI chip 213 and a Single Chip mode for using the LSI chip 203 alone according to the presence or absence of bonding to the electrode pad 205a. Namely, the LSI chip 203 equipped with the mask ROM as the program memory and the LSI chip 213 equipped with the batch erasable EEPROM for the program memory are utilized in combination in the semiconductor device according to the second embodiment of the present invention. Thus, when the EEPROM version micon is selected, the LSI chip 203 and the LSI chip 213 are combined together so as to serve as an MCP, thereby making it possible to operate it as a micon. When the mask ROM version micon is selected, it can be operated as a micon by using the LSI chip 203 alone without being utilized as an MCP using the LSI chip 213.

Owing to such a configuration, the semiconductor device according to the second embodiment of the present invention can obtain the following advantageous effects in addition to the effects obtained by the semiconductor device according to the first embodiment.

The first resides in that since the LSI chip 213 of the MCP type EEPROM can be designed aside from the LSI chip 203, the EEPROM version micon can also be implemented simultaneously by simply newly designing the LSI chip 203 corresponding to the mask ROM version micon. Namely, since it is not necessary to individually develop the EEPROM version micon and the mask ROM version micon respectively, the shortening of development TAT and a reduction in the cost of development can be achieved. Since the LSI chip 213 of the MCP type EEPROM can be applied even to various micons without being limited to a specific micon, a reduction in development cost can be expected.

The second resides in that since the LSI chip 203 used as the mask ROM version micon is used as a base even in the case of the EEPROM version micon, a difference in various characteristics such as electrical characteristic, noise characteristics, etc. can extremely be reduced by applying a common circuit to a configuration other than a program memory. As a result, it is easily feasible to provide the EEPROM version micon and the mask ROM version micon which produce no difference in EMC specs.

The third resides in that as compared with the case in which the EEPROM version micon is implemented by application of a special manufacturing process thereto-as in the prior art, an EEPROM unit can be implemented by applying the conventional high-withstand process thereto and other micon's circuit units can be implemented by applying the conventional MOS process thereto. Therefore, the EEPROM version micon can be implemented at a further reduced cost.

The fourth resides in that the replacement of the LSI chip 213 with another makes it possible to develop micons adapted to various specs in a short period of time. Micons different in, for example, memory size, the number of times that the rewriting of a batch erasable EEPROM is assured, operating voltage, etc. can be implemented by simply newly developing the LSI chip 213.

Incidentally, the second embodiment has been described by applying the LSI chip 203 as the mask ROM version micon. However, a micon free of a program memory, i.e., having no mask ROM is developed as the LSI chip 203, and each of a mask ROM micon and a batch erasable EEPROM micron is developed as the LSI chip 213. Thereafter, the mask ROM version micon and the EEPROM version micon may be implemented by applying any of them thereto as the program memory. Since, in this case, the pad electrodes 225 are electrically connected to their corresponding pad electrodes 215 of the LSI chip 213 in either case, the circuits and the like shown in FIGS. 7 through 9 become unnecessary.

The LSI chip 213 utilized in combination with the LSI chip 203 used as the mask ROM version micon is not limited to the batch erasable EEPROM and may be a mask ROM or an EPROM or the like. When, for example, the capacity of a mask ROM placed over the already-developed LSI chip 203 lacks, a mask ROM large in memory capacity is developed through the LSI chip 213 without newly developing the LSI chip 203, and the LSI chip 203 makes use of the mask ROM of the LSI chip 213, thereby making it possible to easily cope with the lack of the memory capacity.

The first and second embodiments of the present invention have been described in detail above. Particularly, the second embodiment has described the LSI chip 203 as the mask ROM version micon and the LSI chip 213 as the batch erasable EEPROM for the program memory. However, the following can be applied as the LSI chip 213.

(1) One equipped with a batch erasable EEPROM and an analog circuit such as an analog-digital converter or the like (2) Analog circuit such as an analog-digital converter or the like (3) One equipped with a batch erasable EEPROM and an SRAM (4) Mask ROM (5) DRAM (6) SRAM (7) EEPROM A low voltage (e.g., source voltage Vdd=1.6V to 2.0V in a 0.18 $\mu$m process) is used in a Logic process employed in a micon or the like, for example. On the other hand, a circuit unit such as an analog-digital converter or the like, which handles an analog signal, needs to maintain the conventional interface level (5V or 3V) used in a sensor, an actuator, etc. The above (1) and (2) can sufficiently cope with it. Described specifically, a mask ROM version micon excluding an analog circuit is developed as the LSI chip 203. As the LSI chip 213, a system LSI is implemented by applying the circuit shown in the above (2) and combining these LSI chips together as the MCP type as described in the first or second embodiment. In the case of an EEPROM version micon, the above (1) may be applied as the LSI chip 213. In this case, the mask ROM version micon may be brought to the commercial stage as a micon unequipped with the analog circuit without developing the above (2).

Further, the above (3) can be used to simultaneously implement the addition of memories for data storage in the second embodiment. In this case, the SRAM of the LSI chip 213 is used as an add-in memory for data storage, and the batch erasable EEPROM is used as a program memory.

Further, the above (4) to (7) are applied for implementation as for the addition of data storage memories placed on the LSI chip 203 and for mixed loading of memories, which serves as a manufacturing process different from that for the LSI chip 203. When, for example, a space for the data storage memory placed in the LSI chip 203 is exceeded, an address control signal and a chip select signal may be controlled so that accessing is shifted to the add-in memory for data storage placed within the LSI chip 213. If done in this way, then a desired system LSI can be implemented in a short period of time without an increase in product's cost.

Incidentally, the first and second embodiments have shown the MCP type semiconductor device implemented as the system LSI by using the two LSI chips and interconnecting them with each other. It is needless to say that three or more LSI chips may be interconnected with one another to form a semiconductor device which implements a function set as a system LSI. For example, four LSI chips comprising an LSI chip used as a mask ROM version micon, an LSI chip used as a batch erasable EEPROM, an LSI chip used as a power control circuit, and an LSI chip used as a communication analog LSI may be interconnected with one another and accommodated in one package to implement a function set as a system LSI.

The system LSIs typified by the micons have been described by way of example in the first and second embodiments. However, the present invention is not necessarily limited to those. The present invention is applicable even to the following cases as applications of the present invention.

For example, a plurality of LSI chips difficult for fabrication thereof on the same semiconductor substrate, which is one gist or substance of the present invention, and different in manufacturing process, may be interconnected with one another to implement an LSI. For example, a power LSI to which a bipolar process is applied, and an LSI to which a Logic process used for control of the power LSI is applied, may be connected to each other and held in one package.

Further, the present invention can be applied even among a plurality of LSI chips (any of them being one to which the Logic process is applied) capable of being manufactured on the same semiconductor substrate and similar in manufacturing process. For example, a communication LSI already developed and equipped with a number of analog circuits each operable as a single LSI, and a micon used for controlling the communication LSI may be interconnected with each other and held in one package. If done in this way, then different LSIs with high added values can be developed in a short period of time.

Thus, it is of importance that in either case, a plurality of LSI chips held in one package are interconnected with one another so as to allow the transfer of data or the like, and a desired function defined as a semiconductor device is implemented by these plural LSIs.

In the second embodiment, the circuit placed within the LSI chip 203 selectively determines the use of the LSI chip 213 according to the presence or absence of wire bonding effected on the pad electrode 205a. However, the present invention is not necessarily limited to it. A selection similar to the above can be implemented even by other methods to be next described.

The first is a method of performing a chip selection using a mask layer for a mask ROM employed in the LSI chip 203. Namely, as a mask layer for determining a code (program) employed in the mask ROM, may be mentioned, various layers such as a metal layer, a contact layer, an implanted layer, etc. according to the type of memory. The mask ROM is fabricated using a desired mask corresponding to the program code. Therefore, the mask for the mask layer is used as for the above selection in addition to one for the code used in the mask ROM to thereby allow the selection and designation of an LSI chip. If the LSI chip 213 is selected and processed for the purpose of its use in this case, then the LSI chip 203 cannot be used singly. However, if done in the above-described manner, it is then unnecessary to provide a special pad electrode for selection, such as the pad electrode 205a. Since the code mask used for the mask ROM can be shared for the selection, it is possible to prevent an increase in cost due to an increase in the number of masks, etc., and an increase in manufacturing process.

Next, there is known a method of performing a chip selection using a fuse ROM. Namely, a fuse (hereinafter called "fuse ROM") comprised of a metal wire capable of being broken by causing a predetermined current to flow therethrough or by laser is placed within the LSI chip 203. Thereafter, the corresponding LSI chip may be selected according to the broken state thereof. If a description is made by the example shown in FIG. 7, then such a configuration that a source voltage is applied through the fuse ROM used in place of the pad electrode 205a is taken. The application of the source voltage to an AND gate and the application of the ground voltage thereto through the pull-down resistor 251 may selectively controlled according to the broken state of the fuse ROM. Since a selecting process can be done upon wafer probing of the LSI chip 203 if such a configuration is taken, flexible handling can be achieved if consideration is given to control on stocks, etc.

Next, a method of setting a predetermined pad electrode 205 of the LSI chip 203 as a pad electrode dedicated to selection is known. This is one wherein the pull-down resistor 251 shown in FIG. 7 is omitted, the pad electrode 205a is electrically connected to its corresponding lead dedicated to selection, and a selecting process is done according to the application of a source voltage to the lead or the application of a ground voltage thereto. If done so, then a mask ROM version micon and an EEPROM version micon can be easily selected even after a semiconductor device held in a package has been built in an electronic device or apparatus. As a result, device's debugs and difference evaluations with respect to the mask ROM version micon and the EEPROM version micon can be implemented with satisfactory accuracy and at low cost.

As the method of providing the lead and pad electrodes dedicated to selection as described above, different programs may be incorporated into the LSI chip 203 and the LSI chip 213 respectively. Namely, micons capable of implementing different operations corresponding to different programs can be selectively implemented according to the potential level of a signal supplied to a selection-dedicated lead. In other words, one micon can be utilized according to two types of uses as a package. Since the electronic device to which such a semiconductor device is applied, can perform switching to the micon without turning off the power, for example, the succession of each program stored in the mask ROM of the LSI chip 203 may sequentially be executed by each program stored in the EEPROM of the LSI chip 213. After the LSI chip 203 for one micon (mask ROM version micon) has been developed, the LSI chip 213 can be set up as an applied product of the micon by its development.

Next, there is known a method of selecting an LSI chip according to the program stored in the mask ROM of the LSI chip 203 or the program stored in the EEPROM of the LSI chip 213. Namely, a program-based start-up at an initial operation (default) of a micon wherein the LSI chip 203 and the LSI chip 213 are held in one package, is determined based on either of the program stored in the mask ROM of the LSI chip 203 and the program stored in the EEPROM of the LSI chip 213. Thereafter, a decision as to which LSI chip should be used (which program of LSI chip should be used), may be performed according to the initial program routine for the selected program of LSI chip. For example, the potential level of the signal inputted from the above-described selection lead is confirmed based on the start-up program used as the program routine, and the result of confirmation thereof is held by a mode designation register or the like built in a micon according to the result of confirmation thereof. Afterwards, the result of its confirmation may be used as a select signal indicative of which program of LSI chip should be used.

Incidentally, a method of confirming the state of the register referred to above may be used as the method of selecting the corresponding chip according to another program used as the start-up program. Such a method is feasible if a register set or reset according to whether the LSI chip 213 is connected to the LSI chip 203 so as to allow the transfer of data therebetween, is such a register as to hold a flag indicative of the state of the register.

Next, there is known a method of performing a chip selection by hardware such as a determination circuit or the like for making a decision as to whether the LSI chip 213 is connected to the LSI chip 203 so as to allow the transfer of data therebetween. Namely, such a determination circuit determines the presence or absence of the LSI chip 213 upon micon's initialization or the like. When the LSI chip 213 is judged to be absent, a program on the LSI chip 203 side may be started up. When the LSI chip 213 is judged to be present, a program on the LSI chip 213 side may be started up. One similar to such a configuration as shown in FIG. 7 is applicable as this type of determination circuit. This may be connected to a desired judgeable signal line without being connected to the pad electrode 205a. The decision of such a determination circuit may be performed by accessing to a predetermined register via a bus line or by connecting desired pad electrodes of two LSI chips to each other by determining/detecting wires or the like and utilizing such a connected state (e.g., corresponding to one in which, for example, a source voltage is applied when they are being connected to each other, and an open state is reached when they are not connected to each other).

A description has been made in detail of the modifications and applications related to the combination of the two LSI chips and the selecting process thereof employed in the first and second embodiments. Modifications and applications related to layouts such as the layout of pad electrodes, etc. will next be described below.

In the first and second embodiments, the pad electrodes 125 and the pad electrodes 225 are placed in areas (substantially central positions in distances between parallel outer peripheral sides of the two LSI chips in the drawings) relatively close to the outer peripheries of the LSI chips 113 and 213 as shown in FIGS. 2 and 5. As represented by a plan view of FIG. 10, pad electrodes 325 are further placed in their corresponding positions closer to the outer periphery of the LSI chip 113 as viewed from the outer periphery of the LSI chip 103 within an area in which the LSI chip 113 is placed. In the placement of such pad electrodes, wires 107 for respectively connecting leads 9 and pad electrodes 105 and wires 117 for respectively connecting pad electrodes 115 and the pad electrodes 325 do not intersect each other. However, the following problems are taken into consideration.

A first point resides in that when the size of the LSI chip 113 placed over a main surface of the LSI chip 103 is changed, handling associated with the size change becomes difficult or allowance therefor is reduced. Such a size change is considered to be sufficiently within the bounds of possibility that it will be developed due to specs changes such as an increase in memory size, etc., and a change in manufacturing process to be applied.

A second point resides in that since the pad electrodes 125 and 325 or the like are respectively placed in areas close substantially to the centers of the LSI chips 103, restrictions such as the difficulty of placement or layout of protection circuits for these pad electrodes 125 and 325 or the like, an increase in needless area, the division of a circuit module employed in the LSI chip 103 by the areas for the placement of the pad electrodes 125 and 325, etc. might be imposed on layout design of the LSI chip 103. Such restrictions make it impossible to efficiently perform the layout design of LSI by application of the normally-used CAD system.

Figure 10:
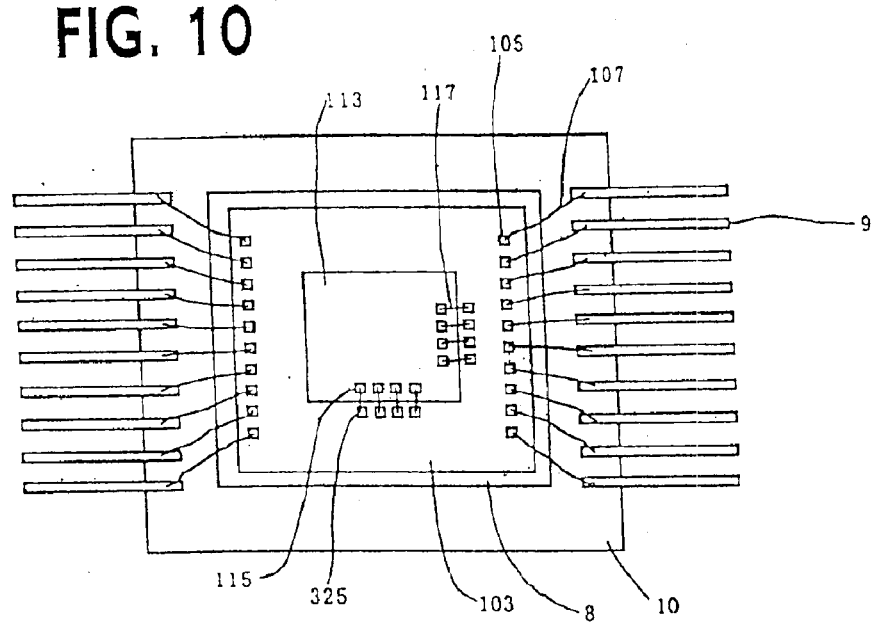
FIG. 10 is a plan view of a semiconductor device illustrative of a modification of FIG. 2.
Figure 11:
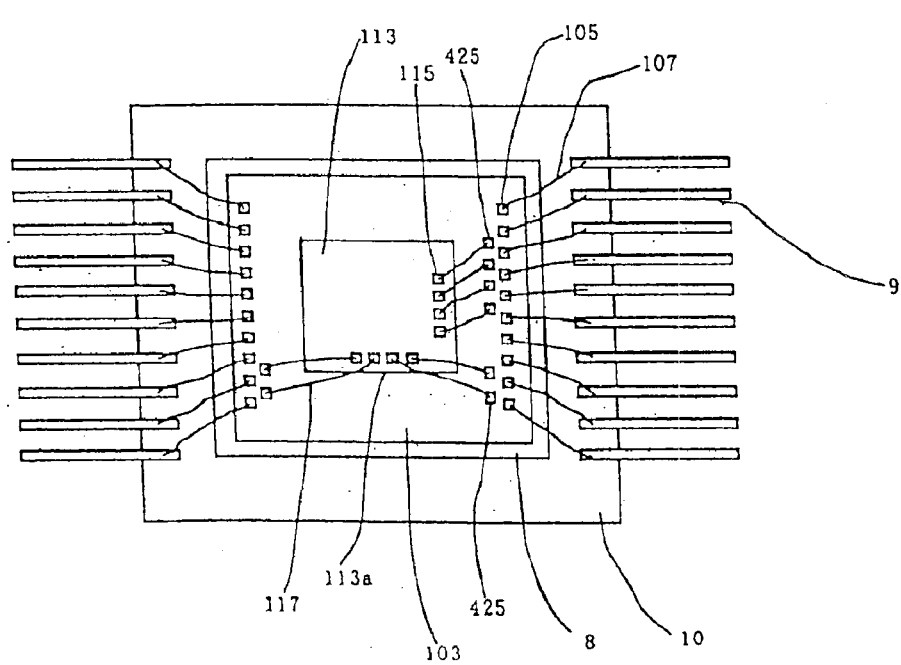
FIG. 11 is a plan view of a semiconductor device illustrative of another modification of FIG. 2.

Such a layout of pad electrodes as shown by a plan view of FIG. 11 can be applied to solve such a problem. In FIG. 11, elements of structure similar to those shown in FIG. 10 are identified by the same reference numerals.

In FIG. 11, pad electrodes 425 equivalent to the pad electrodes 125 and 325 are placed in staggered form with pad electrodes 105 at their corresponding positions close to the outer periphery of an LSI chip 103 as viewed from the outer periphery of an LSI chip 113. Other configurations are similar to those shown in FIG. 10. Thus, since the pad electrodes 105 for connection to leads and the pad electrodes 425 for connection to pad electrodes 115 are alternately placed in staggered form, the above-described problem can be solved and an efficient layout can be implemented in space-saving form.

Next, any of the above embodiments and modifications or the like has shown, as an example, the case where the pad electrodes are respectively placed over only the two sides of the LSI chip 103 and the LSI chip 113. No limitation is imposed to this. An example may be used in which as shown by a plan view of FIG. 12 by way of example, pad electrodes 505 equivalent to the pad electrodes 105 are placed along the four sides of an LSI chip 503 equivalent to the LSI chip 103, and pad electrodes 515 equivalent to the pad electrodes 115 are placed along the four sides of an LSI chip 513 equivalent to the LSI chip 113. Pad electrodes 525 equivalent to the pad electrodes 125 are placed in staggered form together with the pad electrodes 505 in accordance with the placement of the pad electrodes 115. The pad electrodes 505 are electrically connected to their corresponding leads 9 by wires 507, and the pad electrodes 515 are electrically connected to their corresponding pad electrodes 525 by wires 517.

Figure 12:
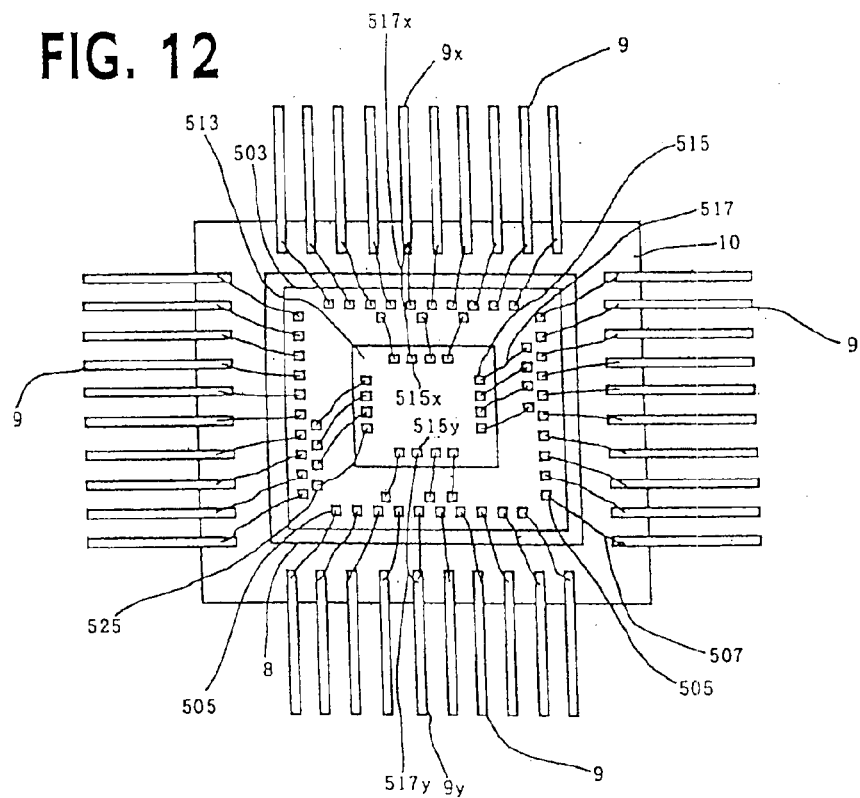
FIG. 12 is a plan view of a semiconductor device showing an application of FIG. 11.

The pad electrodes shown in FIG. 12 are laid out along the four sides of the respective LSI chips in terms of the relation between the size of the LSI chip 503 and the size of the LSI chip 513, the number of the pad electrodes 525, and design restrictions on the mounting of these pad electrodes 525 for wire bonding. However, if practicable, it is then desirable to place pad electrodes 615 equivalent to the pad electrodes 515 so as to concentrate on the opposed two sides of an LSI chip 613 equivalent to the LSI chip 513, and place pad electrodes 625 equivalent to the pad electrodes 525, of an LSI chip 603 equivalent to the LSI chip 503 along the opposed two sides of the LSI chip 603 as shown by a plan view of FIG. 13.

Figure 13:
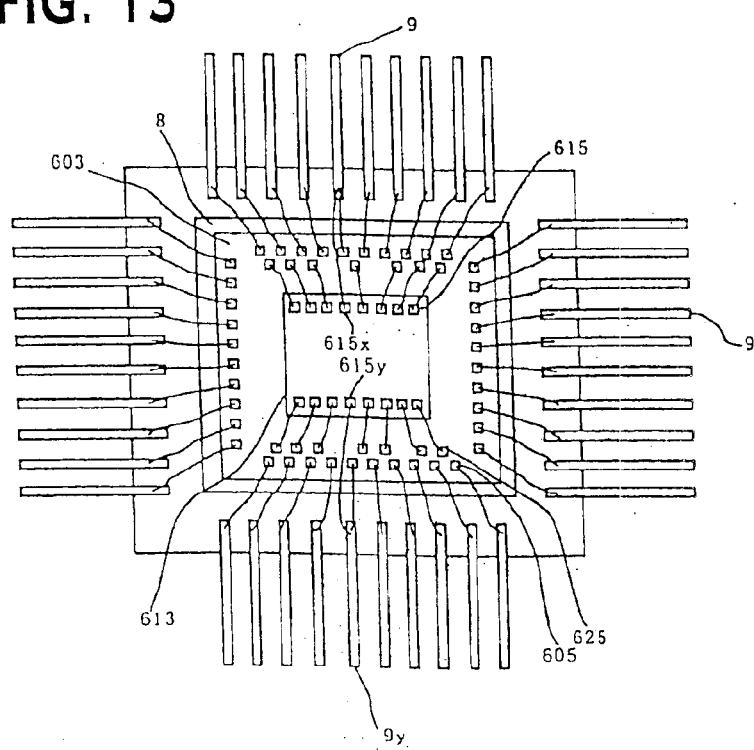
FIG. 13 is a plan view of a semiconductor device showing a modification of FIG. 12.

The following advantageous effects can be expected by placing the pad electrodes as shown in FIG. 13. A predetermined distance is required to be ensured in terms of mounting due to restrictions at wire bonding as the distance between the pad electrode 615 and pad electrode 625 used for an internal interface, for example. Since, however, the aforementioned restrictions are not imposed on the sides free of the placement of such pad electrodes 615, the outer peripheral portion of the LSI chip 613 can be brought closer to the neighborhood of pad electrodes 605 for connection to leads. For example, such a configuration as shown by a plan view of FIG. 14 can be taken.

Figure 14:
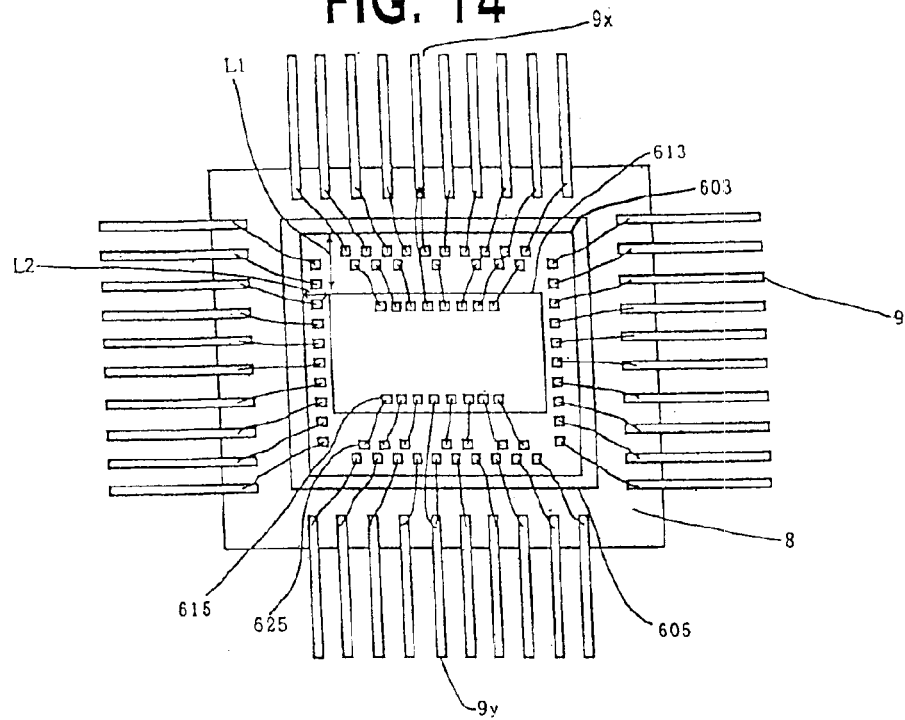
FIG. 14 is a plan view of a semiconductor device depicting an application of FIG. 13.

It will be understood from FIG. 14 that the size of an LSI chip 613, which extends in the horizontal direction as viewed in the drawing, increases. Namely, a distance (L2) between the side of the LSI chip 613 on the non-placement side of pad electrodes 615 and the side of an LSI chip 603 on the non-placement side of the pad electrodes 625 is shorter than a distance (L1) between the side of the LS chip 613 on the placement side of pad electrodes 615 and the side of the LSI chip 603 on the layout side of the pad electrodes 625.

Therefore, the degree of freedom of design and form increases because the embodiments shown in FIGS. 13 and 14 provide less restrictions on the size and form of the LSI chip 613 as compared with the embodiment shown in FIG. 12. If the size of the LSI chip 613 can be brought as closer to the size of the LSI chip 603 as practicable, then a thick portion increases correspondingly and hence the resistance to an external stress can also be further increased.

Incidentally, FIGS. 13 and 14 have respectively shown, as examples, the cases in which the pad electrodes 615 and the pad electrodes 625 for the interface are respectively placed over the two sides. However, the pad electrodes 615 and the pad electrodes 625 for the interface may be placed over three sides or one side.

Thus, signals for these pad electrodes 625 can be collectively laid out over the LSI chip 603 by bringing the sides on which the pad electrodes 615 and pad electrodes 625 for the interface are placed, into focus. It is therefore possible to carry out efficient wiring and simultaneously test these LSI chip 613 in plural form upon wafer probing of the LSI chip 613.

A description will next be made below of a modification about a test on the semiconductor device of the present invention. In the present invention, a plurality of LSI chips held in one package are used to implement a desired function in an MCP type semiconductor device. Therefore, whether or not the desired function is properly executed, is tested using the leads 9 upon testing on the post-assembly semiconductor device, whereby the selection of either a non-defective product or a defective product can be carried out. In the semiconductor device of the present invention, for example, a test circuit capable of individually testing the LSI chip 103 and the LSI chip 113 respectively may more preferably be built in the LSI chip 103, for example. The desired function is made possible by providing a test function of allowing the input of a signal having a predetermined potential level to one lead 9 for providing test instructions and one pad electrode 105 for providing test instructions and permitting each individual tests. In such a case, the input/output lead of the leads 9 may be controlled based on this test signal so as to be selectively connected to an input/output signal of the LSI chip 103 and an input/output signal of the LSI chip 113 by the selection circuit shown in FIG. 9. By doing so, the LSI chip 113 comprised of the batch erasable EEPROM, for example, can be tested by a memory tester using the leads 9, and the LSI chip 103 can be generally tested by a Logic tester. It is thus possible to improve coverage for the test.

A description will next be made below of a modification related to wire bonding employed in the semiconductor device of the present invention. In the first and second embodiments, the pad electrodes for source and ground and the like, of the pad electrodes 115 of the LSI chip 113 are also electrically connected to their corresponding pad electrodes 125. However, a problem arises in that consideration is given to the fact that the pad electrode for source, the pad electrode for ground and the pad electrode for the analog signal, of the pad electrodes 115 are under the influence of noise, and when the amount of current increases as in the case of the pad electrode for source on occasion, portions connected to these pad electrodes employed in the LSI chip 103 increase in layout and desired performance cannot be implemented.

In order to cope with such a problem, pad electrodes 515x and 515y shown in FIG. 12 may be electrically connected directly to their corresponding leads 9x and 9y by wires 517x and 517y. In FIG. 12, for example, the pad electrode 515x corresponds to a pad electrode for source, the pad electrode 515y corresponds to a pad electrode for ground, the lead 9x corresponds to a lead for source, and the lead 9y corresponds to a lead for ground, respectively. Further, a pad electrode 615x equivalent to the pad electrode 515x and a pad electrode 615y equivalent to the pad electrode 515y are shown even in FIG. 13.

Since the leads 9x for source and the leads 9y for ground are respectively electrically connected directly to the pad electrodes for source and the pad electrodes for ground, of the LSI chips 515 and 615 by wire bonding as shown in FIGS. 12 and 13, the above-described problem can be solved. Thus, since noise developed in a source system can be prevented from being passed around and the supply of power or the like through internal wires or interconnections of the LSI chips 503 and 603 becomes unnecessary, it is also unnecessary to ensure a metal width of each wire for coping with a large current flowing in each of the LSI chips 503 and 603.

Figure 15:
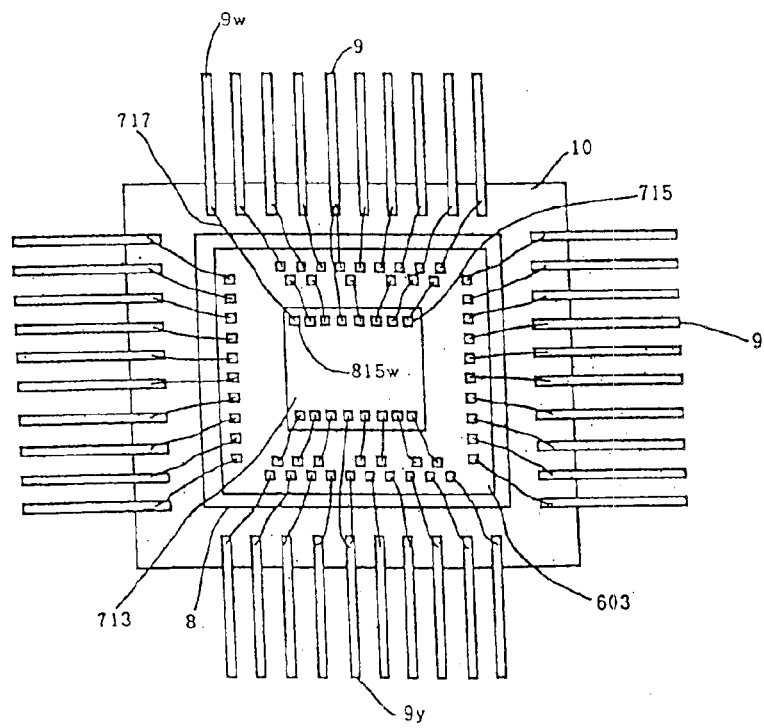
FIG. 15 is a plan view of a semiconductor device showing a modification associated with wire boding.

As to the analog-signal pad electrode of the pad electrodes 115 in the LSI chip 113, a lead 9w for an analog signal and a pad electrode 715w for the analog signal are electrically directly connected to each other by a wire 717 as shown by a plan view of FIG. 15. If done in this way, then the above-described problem can be solved. The ground pad electrode employed in the LSI chip 113 can also be handled as in the relation between the pad electrode 715w and the lead 9w shown in FIG. 15.

The placement of oscillator circuits in the semiconductor device of the present invention will next be described below. When the LSI chip 103 and the LSI chip 113 respectively need different source oscillation clocks from the viewpoint of the placed circuits, it is necessary to build the oscillator circuits in their corresponding LSI chips and connect crystal oscillators thereto respectively. Since, in this case, the length of a wire extending to its corresponding lead becomes long and the component of a coil increases in the oscillator circuit on the LSI chip 113 side, the influence of induction becomes large.

In such a case, the oscillator circuit for the LSI chip 113 may be provided on the LSI chip 103 side. Even though the LSI chip 113 is equipped with the oscillator circuit, the oscillator circuit for the LSI chip 113, which is used as an alternative to one for the LSI chip 103, may input a desired clock to the LSI chip 113 without using the oscillator circuit placed on the LSI chip 113.

A structure of the semiconductor device of the present invention will next be explained below. Even in the case of any of the above-described embodiments, for example, the LSI chip 103 large in chip size is placed below and the LSI chip 113 small in chip size is placed over the LSI chip 103. As in the batch erasable EEPROM, the application of stress to a portion above each memory cell exerts an influence on circuit's various characteristics such as endurance characteristics, etc. An LSI chip susceptible to the stress may always be laid out as one placed on the upper side of, for example, two LSI chips as a layout capable of carrying out a further reduction in the influence of the stress as in the case of the LSI chip 113.

While the present invention has been described in detail above, it is needless to say that various improvements and changes can freely be made within the scope not departing from the substance thereof.

While the pad electrodes 505 and the pad electrodes 525 are laid out in staggered form in FIG. 12, for example, no limitation is imposed to this layout. The layout shown in FIG. 12 is applied to cases where in terms of restrictions on the layout, the interval between the adjacent pad electrodes 505 placed within the LSI chip 503 is narrow and the placement of a protection circuit with respect to the pad electrodes 525 is limited. When the limitation on the placement of the protection circuit for the pad electrodes 525 is lifted and the interval between the adjacent pad electrodes 505 employed in the LSI chip 503 can be set relatively wide (to an area corresponding to such an extent that other pad electrodes can be respectively placed between the adjacent pad electrodes 505, for example), the pad electrodes 525 may be placed between the adjacent pad electrodes 505 respectively. Namely, the pad electrodes 505 and the pad electrodes 525 may be placed in line in a row at the respective sides around the outer periphery of the LSI chip 503. Since, in this case, the wires for source and ground laid out in the neighborhood of these pad electrodes 505 can be shared between the protection circuit for the electrodes 505 and the protection circuit for the electrodes 525, they are more effective.

While the second embodiment has shown an example using such a circuit as shown in FIG. 7, the present invention is not limited to such a circuit configuration as shown in FIG. 7. When it is desired to set the potential level of the select signal SEL to the reverse of the above-described one, for example, the pull-down resistor 251 is used as a pull-up resistor placed between the source potential and the pad electrode 205a and the pad electrode 205a may be selected according to whether it is connected to a lead for ground by a wire. This can be implemented even when the following configuration is taken.

Figure 19:
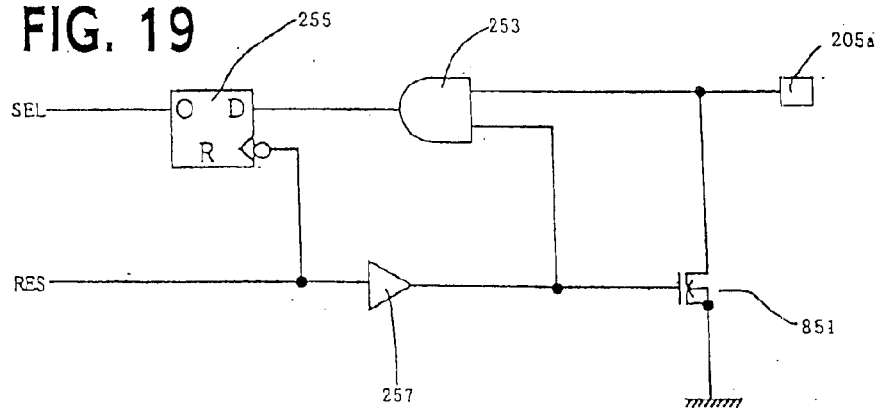

FIG. 19 shows a modification of the circuit shown in FIG. 7. In FIG. 19, the same elements of structure as those shown in FIG. 7 are identified by the same reference numerals.

In FIG. 19, an N channel MOS transistor 851 is provided as an alternative to the pull-down resistor 251 shown in FIG. 7. Other elements of structure in FIG. 19 are similar to those shown in FIG. 7. One electrode (e.g., drain) of the MOS transistor 851 is electrically connected to a pad electrode 205a, and the other electrode (e.g., source) is grounded. A reset signal RES is inputted to a gate electrode of the MOS transistor 851 through a buffer 257.

Owing to such a circuit configuration as shown in FIG. 19, when the potential level of the reset signal RES becomes an H level, the MOS transistor 851 is brought into conduction. If the pad electrode 205a is electrically connected to a lead 9a for source by a wire at this time, then a signal whose potential level is of an H level, is inputted from an AND gate 253 to a LAT 255. In order to reliably execute it, an on-resistance of the MOS transistor 851 at the time that it is brought into conduction may desirably be set to a high resistance as in the pull-down resistor 251. If the pad electrode 205a is not electrically connected from the lead 9a through the wire, then a signal whose potential level is an L level, is inputted from the AND gate 253 to the LAT 255. Thereafter, a select signal SEL having a potential level corresponding to the potential level of the signal inputted to the LAT 255 is outputted from the LAT 255. Even if the potential level of the reset signal RES is returned to the L level, the LAT 255 can maintain the potential level of the select signal SEL. Thus, it is possible to carry out a selection similar to the second embodiment.

As compared with the circuit shown in FIG. 7, the circuit shown in FIG. 19 can reduce a current flowing between the pad electrode 205a and the ground through the use of the MOS transistor 851 except for reset processing (i.e., except when the potential level of the reset signal RES reaches the H level) even if the pad electrode 205a is electrically connected to the lead 9a by the wire. Therefore, the circuit shown in FIG. 19 is capable of reducing power consumption as compared with the circuit shown in FIG. 7. If the resistor 251 is considered to serve as a MOS resistor, there is no difference in layout between the circuit shown in FIG. 19 and that shown in FIG. 7, and the number of elements remains unchanged.

Figure 20:
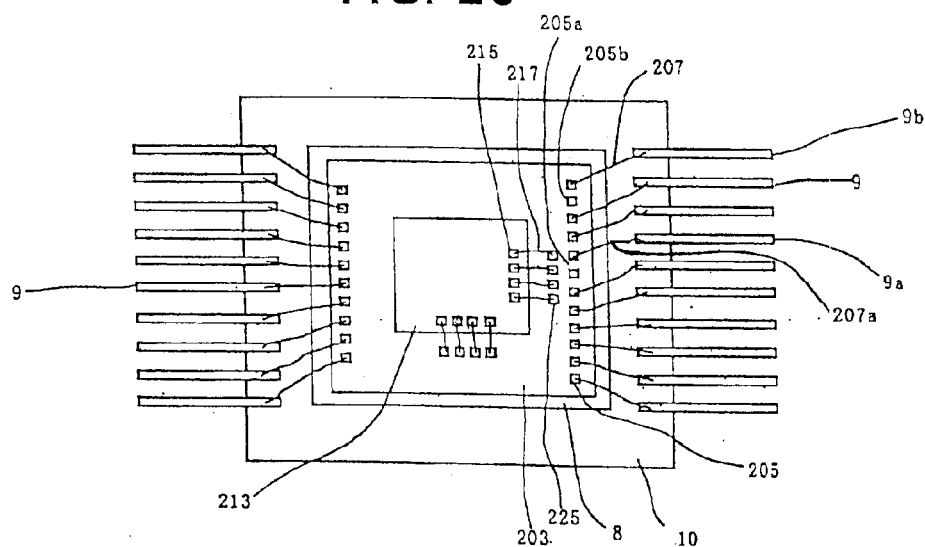
FIG. 20 is a plan view illustrating an internal structure of an MCP type semiconductor device illustrative of a modification of the second embodiment of the present invention.

There is also known a method unusing such a circuit as shown in FIG. 7. FIG. 20 is a plan view showing an internal structure of an MCP type semiconductor device showing a modification of the second embodiment of the present invention. FIG. 20 corresponds to FIG. 5. In FIG. 20, elements of structure similar to those shown in FIG. 5 are identified by the same reference numerals as in FIG. 5.

In FIG. 20, a pad electrode 205b is additionally provided in addition to the configuration shown in FIG. 5. The pad electrode 205b is placed in such a position as to be connectable to its corresponding lead 9b for ground by a wire.

Figure 21:
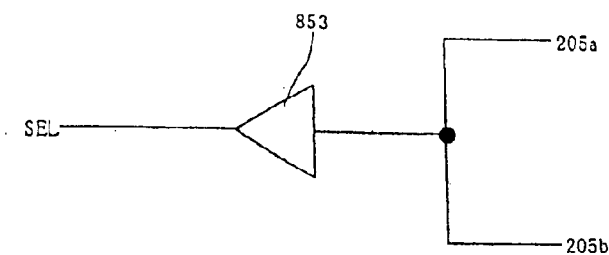
FIG. 21 is a diagram depicting a circuit for an LSI chip 203 connected to a pad electrode 205a and a pad electrode 205b.

FIG. 21 is a diagram showing a circuit of an LSI chip 203, which is connected to the pad electrodes 205a and 205b employed in the modification shown in FIG. 20.

As shown in FIG. 21, the LSI chip 203 is provided with a buffer 853 as an alternative to such a circuit as shown in FIG. 7. The pad electrode 205a and the pad electrode 205b are electrically connected to an input terminal of the buffer 853 through a common wire. Namely, the pad electrode 205a and the pad electrode 205b are wired-OR within the LSI chip 103, followed by connection to the input of the buffer 853. A signal outputted from the buffer 853 is used as a select signal SEL.

Owing to such a configuration as described above, if the pad electrode 205a is electrically connected to its corresponding lead 9a for source by a wire and the pad electrode 205b is in an open state without being electrically connected to its corresponding lead 9b for ground by a wire, then the potential level of the select signal SEL corresponding to the output of the buffer 853 is maintained at an H level. If the pad electrode 205a is in an open state without being electrically connected to its corresponding lead 9a for source by a wire, and the pad electrode 205b is electrically connected to its corresponding lead 9b for ground by the wire, then the potential of the select signal SEL corresponding to the output of the buffer 853 is brought to an L level. Thus, a selection similar to the second embodiment can be carried out.

Since the circuit shown in FIG. 7 becomes unnecessary although the pad electrode 205b is additionally provided by doing in this way, such a configuration can contribute to a reduction in the cost of the LSI chip 203, the scale-down of its size, etc.

When no pad electrode 205b is provided, the input terminal of the buffer 853 is connected to the pad electrode 205a alone and a signal outputted from the buffer 853 may be set as the select signal SEL. In this case, it is desirable that in order to facilitate wire bonding and prevent a short-circuit developed between wires, the source lead 9a and the ground lead 9b are placed so as to adjoin each other, and the pad electrode 205a is placed between a source pad electrode 205d and a ground pad electrode 205g. Thus, the potential level of the select signal SEL can be selectively controlled by wire-bonding the pad electrode 205a to either the source lead 9a or the ground lead 9b.

Figure 22:
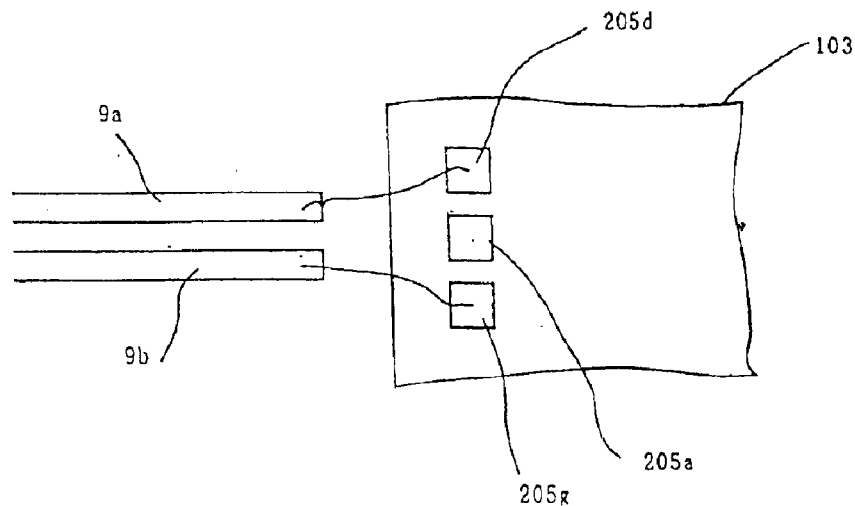
FIG. 22 is a diagram showing the layout of pad electrodes and leads employed in the modification of the present invention.

In order to reduce miswire bonding to the pad electrode 205a at its manufacture, a source lead 9a and a ground lead 9b shown in FIG. 22 may preferably be placed away from each other. It is necessary to eventually provide the pad electrode 205a and the pad electrode 205b as shown in FIG. 20 for the purpose of coping with it.

Further, the following method is also taken into consideration as the method using the pad electrode 205a and the pad electrode 205b.

It is a method of allowing a selective connection between the input terminal of the buffer 853 shown in FIG. 21 and the ground by using the mask layer for the mask ROM employed in the LSI chip 203. Namely, as described above, the various layers such as the metal layer, contact layer, implanted layer, etc. are known as the mask layer for determining the code (program) employed in the mask ROM. The mask ROM is fabricated using a desired mask corresponding to the program code. Therefore, the mask for the mask layer is used as for the above selection in addition to one for the code used in the mask ROM to thereby allow the selection and designation of each LSI chip. If the input terminal of the buffer and the ground are connected to each other by the mask layer, for example, then the potential level of the select signal SEL can be fixed to an L level. In this case, the pad electrode 205a and the pad electrode 205b can both be set open without being electrically connected to desired leads by wire bonding. Therefore, when the use of the semiconductor device as the mask ROM version micon is now determined, the above-described problem can be solved if the potential level of the select signal SEL is fixed by the mask layer. Since the mask for the program code is used in this case, an increase in manufacturing process and an increase in manufacturing cost do not occur either.

When the use of the semiconductor device as the mask ROM version micon is now determined, it is effective to use the pad electrode 205a, the pad electrode 205b and the buffer having the input terminal to which the pad electrodes 205a and 205b are connected, and ground the input terminal of the buffer by the mask layer. A method of meeting a request to such a micon, that it is desired to apply the EEPROM version-micon again, will be explained below.

Figure 23:
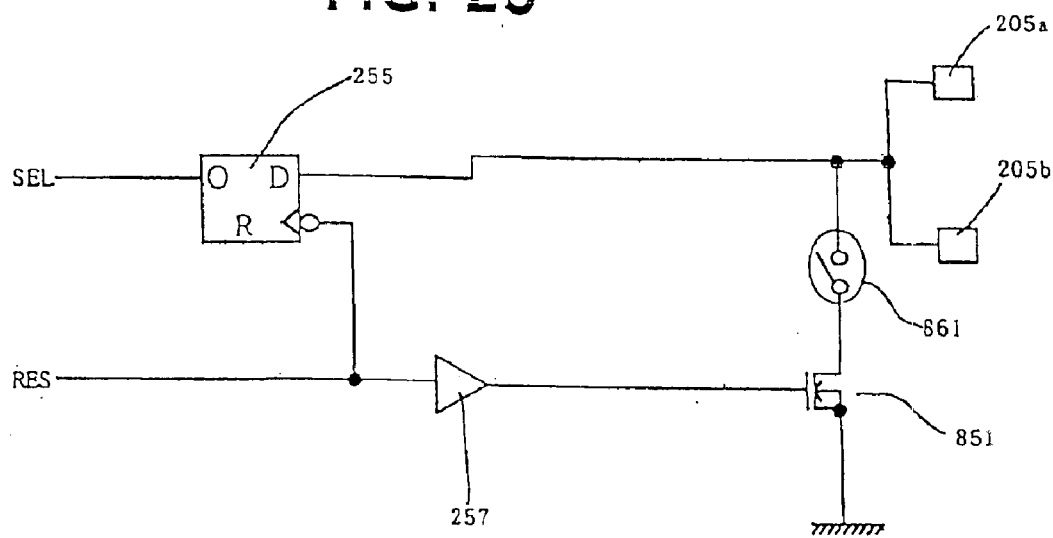
FIG. 23 is a diagram illustrating another example of a circuit for an LSI chip 203 connected to a pad electrode 205a and a pad electrode 205b.

The use of such a circuit as shown in FIG. 23 is effective for such a demand. Since FIG. 23 can be seen in association with FIG. 19, elements of structures shown in FIG. 23 similar to those shown in FIG. 19 are identified by the same reference numerals as those in FIG. 19.

The AND gate 253 shown in FIG. 19 is omitted from the circuit shown in FIG. 23. This is based on the reason mentioned in FIG. 7. A LAT 255, a buffer 257, and a MOS transistor 851 similar to those shown in FIG. 19 are provided as an alternative to the buffer 853. A pad electrode 205a and a pad electrode 205b are wired-OR by a wire within an LSI chip 103 and connected to an input terminal D of the LAT 255. A reset signal RES is inputted to a gate terminal of the LAT 255 and inputted to a gate electrode of the N channel MOS transistor 851 through the buffer 257. One electrode (e.g., source) of the N channel MOS transistor 851 is grounded and the other electrode (e.g., drain) thereof is connectable to the input terminal D of the LAT 255 through a switch unit or means 861 shown in FIG. 23, which selectively performs their connections through the use of the mask layer for the mask ROM previously described. A signal outputted from an output terminal O of the LAT 255 results in a select signal SEL. The circuit shown in FIG. 23 is basically similar in operation to that shown in FIG. 19.

The operation of the circuit shown in FIG. 23 will next be explained. This will be explained on condition that when the potential level of the select signal SEL is an L level, the semiconductor device using the LSI chips 103 and 113 each equipped with the circuit shown in FIG. 23 is set as the mask ROM version micon and when the potential level of the select signal SEL is an H level, the semiconductor device is controlled as the EEPROM version micon. In FIG. 23, the potential level of the select signal SEL can selectively be set based on the reset signal RES according to whether the pad electrode 205a is wire-bonded to its corresponding source lead 9a or the pad electrode 205b is wire-bonded to its corresponding ground lead 9b in a state in which the switch unit 861 is disconnected (i.e., in a state in which the MOS transistor and the input terminal D of the LAT 255 are electrically disconnected from each other within the mask layer). In this case, the semiconductor device can be selected even as either the EEPROM version micon or the mask ROM version micon by wire bonding. If the switch unit 861 is turned on (i.e., if the MOS transistor and the input terminal D of the LAT 255 are in an electrically-connected state within the mask layer), and the pad electrode 205a and the pad electrode 205b are both set open without being subjected to wire bonding, then the potential level of the select signal SEL can be fixed to an L level even if an attempt is made to set the potential level of the select signal SEL, based on the reset signal RES. In this case, the semiconductor device is fixed as the mask ROM version micon.

Further, when the pad electrode 205a is electrically connected to its corresponding source lead 9a by the wire in a state in which the switch unit 861 is in the connected state (i.e., when the MOS transistor and the input terminal D of the LAT 255 are in the electrically-connected state within the mask layer), the potential level of a signal inputted to the input terminal D of the LAT 255 can be brought to an H level. Therefore, even if the switch unit 861 is held in the connected state, the potential level of the select signal SEL can be brought to the H level, based on the reset signal RES. In this case, one fixed as the mask ROM version micon can be forcefully reused as the EEPROM version micon.

Using the circuit shown in FIG. 23 can solve the above-described problem. Further, the circuit shown in FIG. 23 is capable of contributing even to a reduction in power consumption in a manner similar to FIG. 19.

Incidentally, any of the circuits shown in FIGS. 7, 19 and 23 performs the setting of the potential level of the select signal SEL, based on the reset signal RES. Therefore, such a case that the potential level of the reset signal RES whose potential level was of the L level, is temporarily brought to the H level and restored to the L level again, can happen due to unexpected events such as an instantaneous break of a power supply, etc. When it is desired to more reliably obtain the stabilization of the potential level of the select signal SEL in such a case, it is desirable to use, for example, the circuit shown in FIG. 21 rather than the use of the circuits shown in FIGS. 7, 9 and 23, or set the potential level of the select signal SEL regardless of other reset signals RES referred to above.

As a method using the pad electrode 205a alone without the pad electrode 205b without having to use the reset signal RES, the following one can also be provided.

The present method is identical to the aforementioned one in that, for example, an input terminal is connected to a pad electrode 205a and an outputted signal is used as a select signal SEL. This is a method of allowing selective connections between the pad electrode 205a and ground through the use of the mask layer for the mask ROM employed in the LSI chip 203 in place of the non-provision of a pad electrode 205b. If, for example, the pad electrode 205a is set open without being subjected to wire bonding and a mask layer is used to connect between the pad electrode 205a and ground, then the potential level of the select signal SEL can be set to an L level. If the pad electrode 205a is electrically connected to a source lead 9a by a wire when the pad electrode 205a and the ground are not connected in the mask layer, the potential of the select signal SEL can be set to an H level. If a ground lead 9b is placed adjacent to the lead 9a, then the potential level of the select signal SEL can be brought to the L level when the pad electrode 205a and the ground lead 9b are electrically connected to each other by a wire. Further, even if the mask layer is used to connect between the pad electrode 205a and the ground, power consumption increases but the potential level of the select signal SEL can be brought to the H level if the pad electrode 205a is electrically connected to the source lead 9a by the wire.

Various forms can be taken as the selecting methods employed in the second embodiment as described above. Therefore, any of the above-described various selecting methods is applied according to the configuration and purposes of a product to which the semiconductor device of the present invention is applied, thereby making it possible to satisfy their purposes.

While the MCP types, any of which connects between the plurality of LSI chips by using the wires, have been described above by way of example, the present invention is not limited to these. The following can also be considered as ones for application.

For example, a plurality of LSI chips are respectively implemented over a substrate on the same plan side without being stacked on one another and may be interconnected with one another by printed wiring on the substrate. Described specifically, the pad electrodes 105 and the pad electrodes 125 of the LSI chip 103 are wire-bonded so as to be respectively electrically connected to predetermined wiring portions provided over a substrate on which the LSI chip 103 itself is implemented. The pad electrodes 115 of the LSI chip 113 are similarly wire-bonded so as to be respectively electrically connected to predetermined wiring portions provided over a substrate on which the LSI chip 113 itself is implemented. Here, the pad electrodes 115 and the pad electrodes 135 are subjected to wire banding so as to be electrically connected to one another via wires provided over the substrate. Further, the wires on the substrate, to which the pad electrodes 105 are connected by wire bonding, are further electrically connected to external terminals like leads by wire bonding and electrically connected to bump electrodes provided over a plane surface on the non-implemented side of LSI chips via through holes or the like.

Further, the LSI chips may respectively be placed over the front and back of a die for a lead frame or a substrate so as to be interconnected with each other. Described specifically, the LSI chip 103 is placed over the surface of the substrate. Further, the pad electrodes 105 and the pad electrodes 125 of the LSI chip 103 are respectively wire-bonded so as to be electrically connected to predetermined wiring portions provided on the implemented surface side of the LSI chip 103 itself. The LSI chip 113 is placed over the back of the substrate, and the pad electrodes 115 of the LSI chip 113 are respectively subjected to wire bonding so as to be electrically connected to predetermined wiring portions provided on the implemented back side of the LSI chip 113 itself. The pad electrodes 115 and the pad electrodes 125 are electrically connected to one another via the wires and through holes provided in the substrate. The wires to which the pad electrodes 105 are connected by wire bonding, are further electrically connected to external terminals like leads by wire bonding.

Further, the pad electrodes may be provided so as to interconnect the LSI chips by a bump structure. This result in such a configuration that the pad electrodes 105 and the pad electrodes 125 are directly connected to one another without using the wire bonding.

In either case, the LSI chips having the pad electrodes, which show ones like the present invention, can be applied and these plural LSI chips can be interconnected with one another to implement a desired function.

However, as viewed from the need or the like for coping with increases in cost and size due to the use of the substrate, a difficulty in interconnecting between LSI chips using the front and back of a die, and a change in the placement or layout of pad electrodes to be connected to the upper LSI chip, which are employed in the lower LSI chip with respect to a change in the placement of pad electrodes of the upper LSI chip, it can be said that ones interconnected with each other by wire bonding as laminated structures are more suitable.

However, when it is desired to avoid to the utmost, the influence of stress on the LSI chips each using the laminated structure due to various factors such as wire bonding, etc., the two LSI chips are implemented on the substrate as described above and may more preferably be interconnected with each other using the substrate. Therefore, the method using the substrate is suitable for such a product as to place emphasis on a reduction in stress, and a product having other factors capable of sufficiently making up for a cost standpoint.

Although associated even with the influence of stress on the aforementioned LSI chips, the second embodiment has been described with the LSI chip 203 large in size as the micon and the LSI chip 213 small in size as the batch erasable EEPROM. However, the present invention is not necessarily limited to these. For example, the LSI chip 203 large in size and the LSI chip 213 small in size may be set as the batch erasable EEPROM and the micon respectively.

This makes allowance even for the case where the LSI chip used as the micon is smaller in size than the LSI chip used as the batch erasable EEPROM depending on a manufacturing process applied to the laminated two LSI chips, for example. However, when the LSI chip 203 large in size is set as the batch erasable EEPROM and the LSI chip small in size is set as the micon, the following points should be taken into consideration.

Figure 24:
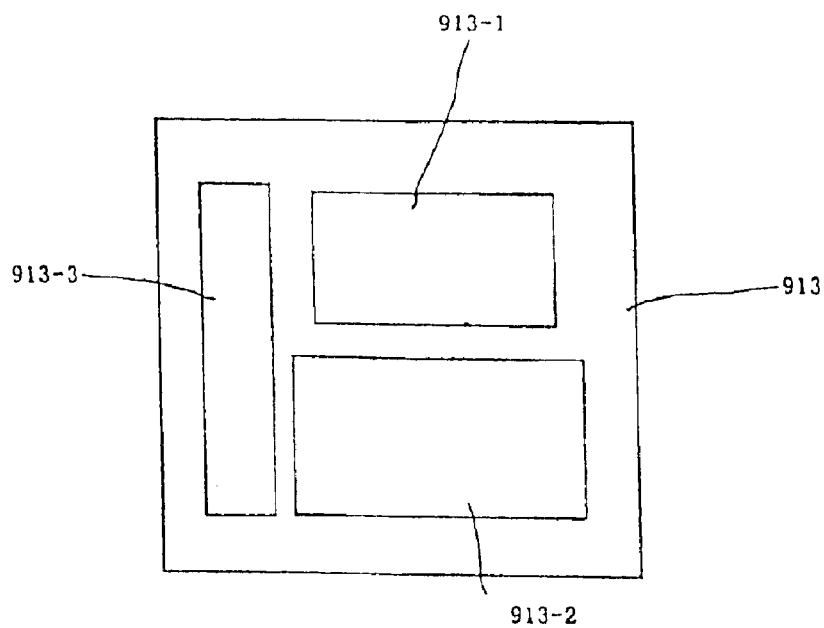
FIG. 24 is a diagram showing the layout of internal circuits where a batch erasable EEPROM is used as an LSI chip 913 corresponding to the LSI chip 203.

FIG. 24 is a view showing the layout of internal circuits at the time that a batch erasable EEPROM is used as an LSI chip 913 equivalent to the LSI chip 203.

Figure 25:
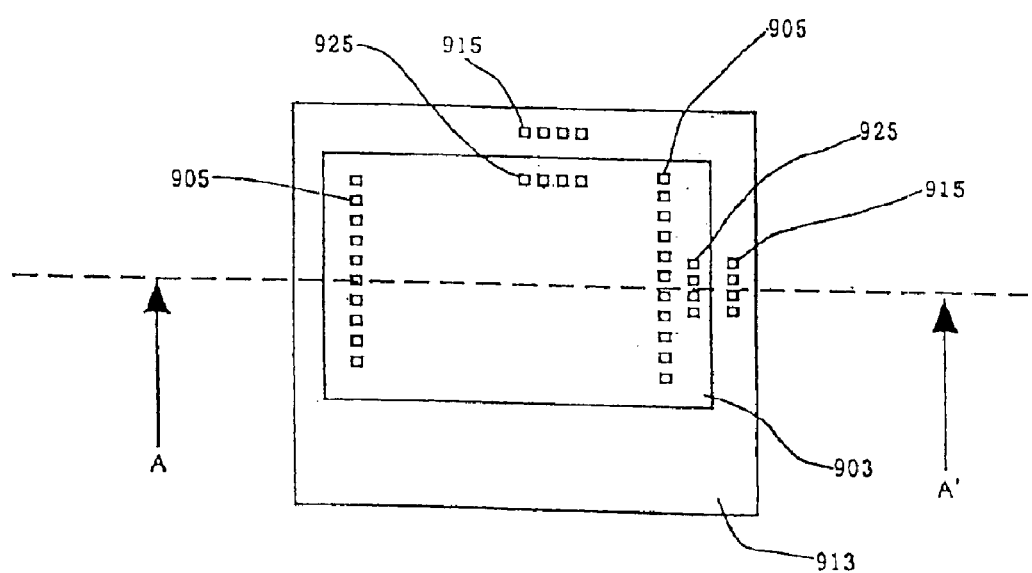
FIG. 25 is a plan view depicting an LSI chip 903 stacked on a main surface of the LSI chip 913.
Figure 26:
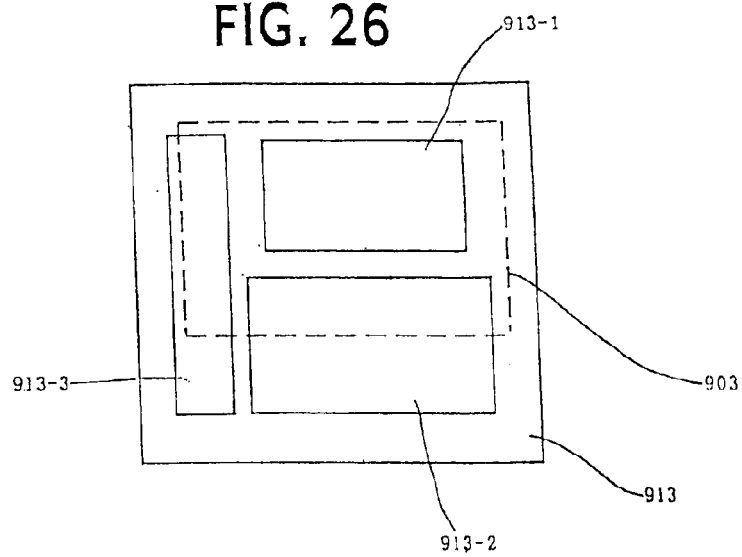
FIG. 26 is a plan view illustrating the relationship of placement between the LSI chip 903 and the internal circuits in the LSI chip 913 both shown in FIG. 25.

The LSI chip 913 comprises a memory cell area 913-1 in which a memory cell unit is placed, a first peripheral circuit area 913-2 in which peripheral circuits such as a charge pump circuit, etc. are placed, and a second peripheral circuit area 913-3 in which other peripheral circuits are placed. At this time, the memory cell unit placed in the memory cell area 913-1 is apt to cause a change in characteristic due to the influence of stress. FIG. 25 is a plan view showing an LSI chip 903 used as a micon, which is stacked on a main surface of the LSI chip 913. FIG. 26 is a plan view showing the relationship of layout between the LSI chip 903 shown in FIG. 25 and the internal circuits in the LSI chip 913. Incidentally, FIG. 25 shows a state in which leads, a resin for encapsulation and wires are omitted therefrom.

As shown in FIG. 25, pad electrodes 915 for interfacing to each internal circuit of the LSI chip 903 are placed over the main surface of the LSI chip 913. In FIG. 25, the pad electrodes 915 are respectively placed in line along the two sides around the outer periphery of the LSI chip 913. The LSI chip 903 is placed over the main surface of the LSI chip 913. Pad electrodes 925 for interfacing to the internal circuits of the LSI chip 913, which are to be respectively electrically connected to the pad electrodes 915, are placed in line over the main surface of the LSI chip 903. The pad electrodes 925 are placed along the respective sides of the LSI chip 903, which are parallel to the sides of the LSI chip 913 along which the pad electrodes 915 are placed, and which are close thereto, in consideration of ease of a wire bonding process. Further, pad electrodes 905 to be electrically connected to leas for connection to unillustrated outer portions are placed in line over the main surface of the LSI chip 903. The pad electrodes 905 may be placed in a staggered arrangement with the pad electrodes 925 along the same sides as those for the placement of the pad electrodes 925, which lie around the outer periphery of the LSI chip 903. Alternatively, the pad electrodes 905 may be placed along the non-placed sides of the pad electrodes 925. If the interval between the adjacent pad electrodes 905 is wide where the pad electrodes 905 are placed along the same sides as the placed sides of pad electrodes 925, then the pad electrodes 925 may respectively be placed between the pad electrodes 905, and the pad electrodes 905 and the pad electrodes 925 may be placed in line in a row. In this case, it is hard to make a distinction between the pad electrodes 905 to be connected to leads and the pad electrodes 925 upon wire bonding. It is however easy to prevent short circuits developed in wires for respectively electrically connecting the pad electrodes 905 and the leads by wire bonding and wires for respectively electrically connecting the pad electrodes 915 and the pad electrodes 925. It is not necessary to increase the height of the top of each wire for electrically connecting the pad electrode 905 and the lead by wire-bonding for the purpose of preventing such short circuits. Therefore, the thickness of the resin for encapsulation can also be made thin. Incidentally, the pad electrodes 925 may be placed in consideration of wire bonding to the leads to be connected.

As shown in FIG. 26, the LSI chip 903 (whose area to be placed is indicated by a dotted line in FIG. 26) is placed so as to fully cover a portion above a memory cell area 913-1 on which a memory cell unit in an LSI chip 913 is placed.

Owing to such a layout, the following advantageous effects can be brought about. Namely, it is understood that due to the difference between thermal expansion coefficients of the LSI chips 903 and 913, the difference between thermal expansion coefficients of resins for encapsulating these LSI chip, etc., an upper portion of each memory cell, which is covered with the LSI chip 903 and an upper portion thereof which is not covered with the LSI chip 903, exist in the memory cell assuming that an area 913-2 shown in FIG. 26 is defined as a memory cell area, for example. When the LSI chips placed in laminated form in such a condition, are sealed with a resin, stress applied to each memory cell becomes nonuniform (particularly, each memory cell at the boundary between the portion covered with the LSI chip 903 and the portion uncovered with the LSI chip 903 in the memory cell area) due to the difference between the thermal expansion coefficients or the like referred to above. As a result, this exerts an influence on the characteristic of the memory cell. Therefore, when another LSI chip 903 is placed over the LSI chip 913 having such a memory cell area in laminated form, the upper portion of the memory cell area 913-1 is placed so as to be fully covered with the LSI chip 903, thereby making it possible to solve the above problem.

Figure 27:
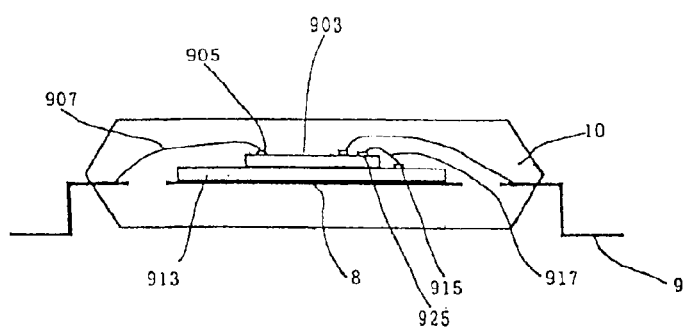
FIG. 27 is a cross-sectional view of a semiconductor device wherein the two stacked LSI chips shown in FIG. 25 are resin-encapsulated.

FIG. 27 is a cross-sectional view of a semiconductor device wherein the two laminated LSI chips shown in FIG. 25 are encapsulated in resin. FIG. 27 is equivalent to a cross-section taken along line A–A' of FIG. 25. Elements of structure similar to those shown in FIG. 1 are identified by the same reference numerals. As shown in FIG. 27, pad electrodes 915 for interface and pad electrodes 925 are respectively electrically connected to one another by wires 917. Further, pad electrodes 905 and leads 9 are respectively electrically connected to one another by wires 907. It is necessary to sufficiently increase the height of the top of each wire 907 for the purpose of avoiding short circuits developed in the wires 907 and 917. The semiconductor device is sealed with a resin for encapsulation 10 with a sufficient thickness to avoid the exposure of the wires 917 to the outside.

Figure 28:
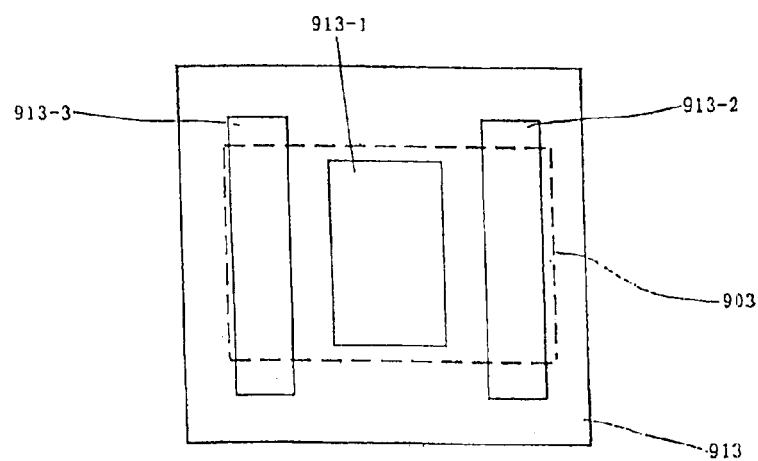
FIG. 28 is a view showing a modification of the layout of the internal circuits in the LSI chip 913.

FIG. 28 is a view showing a modification of the layout of internal circuits employed in an LSI chip 913. In a manner similar to FIG. 26, an area in which an LSI chip 903 is placed, is indicated by a dotted line. In FIG. 28, a memory cell area 913-1 is set to a substantially central area of the LSI chip 913. The periphery of the memory cell area 913-1 is divided into a first peripheral circuit area 913-2 and a second peripheral circuit area 913-3 respectively. When laid out in this way, the upper portion of the memory cell area 913-1 can be fully covered with the LSI chip 903 if the LSI chip 903 is placed over a main surface of the LSI chip 913 so as to cover the substantially central area of the LSI chip 913.

Figure 29:
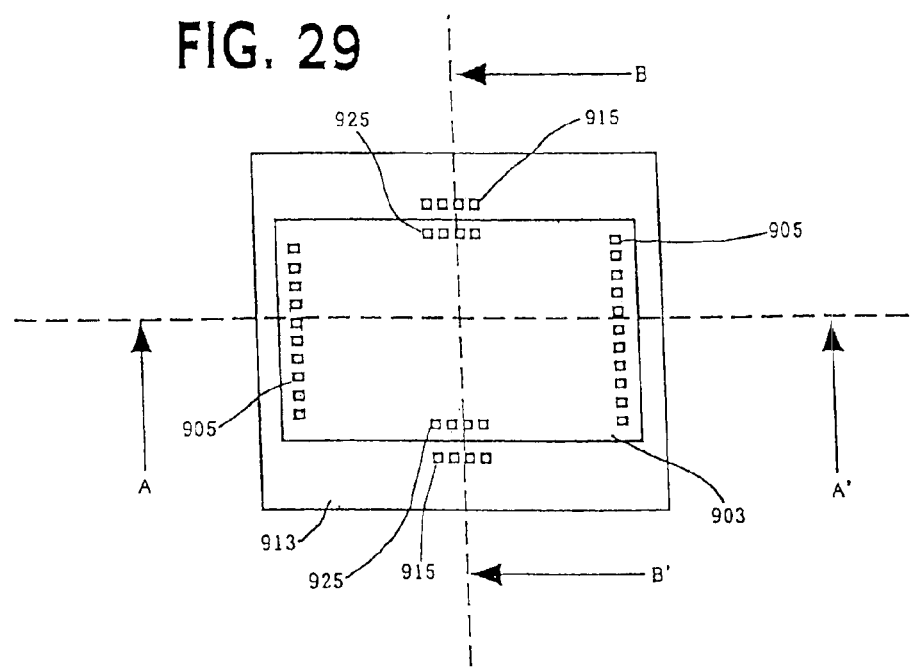
FIG. 29 is a plan view illustrating an LSI chip 903 layered over the main surface of the LSI chip 913 in the modification shown in FIG. 28.

FIG. 29 is a plan view showing an LSI chip 903 used as a micon, which is stacked over the main surface of the LSI chip 913 shown in FIG. 28. By placing the memory cell area 913-1 as shown in FIG. 28, such a layout of pad electrodes as shown in FIG. 29 can be materialized. Namely, the pad electrodes 925 for interface can respectively be placed along the parallel two sides around the outer periphery of the LSI chip 903, and the pad electrodes 905 for connection to leads can respectively be placed along other parallel two sides thereof. The pad electrodes 915 are provided in the neighborhood of the outer periphery of the LSI chip, on which the pad electrodes 925 are laid out.

Figure 30:
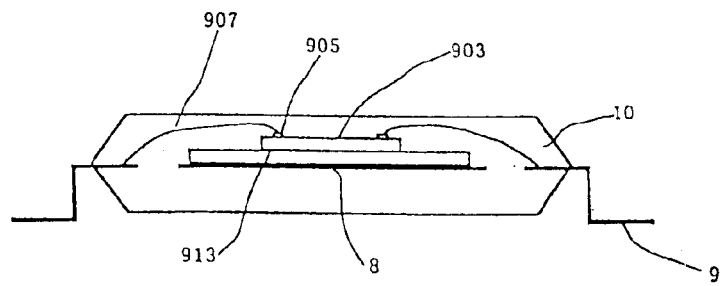
FIG. 30 is a cross-sectional view (corresponding to a cross-sectional view taken along line A–A') depicting a semiconductor device wherein the two layered LSI chips shown in FIG. 29 are resin-encapsulated.
Figure 31:
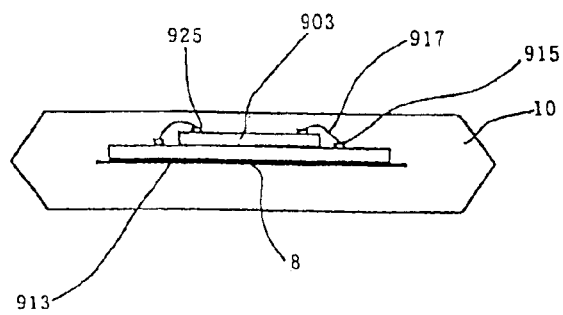
FIG. 31 is a cross-sectional view (corresponding to a cross-sectional view taken along line B–B') showing a semiconductor device wherein the two stacked LSI chips shown in FIG. 29 are resin-encapsulated.

FIGS. 30 and 31 are respectively cross-sectional views of a semiconductor device in which two laminated LSI chips shown in FIG. 31 are sealed with a resin. FIG. 30 is equivalent to a cross-section taken along line A–A' of FIG. 29, and FIG. 31 is equivalent to a cross-section taken along line B–B' of FIG. 29, respectively.

As shown in FIG. 30, the pad electrodes 905 are electrically connected to their corresponding leads 9 by wires 907. As shown in FIG. 31, the pad electrodes 915 are electrically connected to their corresponding pad electrodes 925 by wires 917.

Thus, since the pad electrodes 905 and the pad electrodes 925 can be placed along the different sides on the outer periphery of the LSI chip 903 respectively as is understood from FIGS. 28 through 31, such a problem as to short-circuit the wires 907 and 917 does not arise. Since it is not necessary to increase the height of the top of each wire 907 for purposes of the prevention of such short circuits, the thickness of a resin for encapsulation in FIG. 30 can also be made thin as compared with FIG. 27. Since the pad electrodes 905 and the pad electrodes 925 are placed along the different sides respectively, miswire bonding can also be reduced.

The LSI chip 913 has been described as the batch erasable EEPROM above. If one equipped with a memory cell or circuit which develops a stress problem similar to the batch erasable EEPROM, is used, then the LSI chip 913 is not limited to the batch erasable EEPROM and the methods shown in FIGS. 24 through 31 can be applied. Further, the LSI chip 903 might not be limited to the micon. In an MCP using LSI chips different in size, a sufficient effect can be brought about even if the layout of the LSI chips in the MCP having allowed for such stress is applied to the conventional MCP shown in FIG. 17.

In the present invention as described above, for example, either one of two LSI chips can be applied even if used as a micon or even if used as a memory. Namely, if one LSI chip is provided with the pad electrodes 125 for interface and the pad electrodes 105 for connection to the leads as in the LSI chip 103, then the LSI chip having the pad electrodes 105 and the pad electrodes 205 may be laid out over the other LSI chip when the other LSI chip is large in size. When the other LSI chip is small in size, the LSI chip small in size may be placed over the LSI chip having the pad electrodes 105 and the pad electrodes 205. Owing to the development of one LSI chip in this way, ones having various sizes and functions can be applied as the other LSI chip. Thus, various system LSIs can be offered or provided in a short period of time. Since it is not necessary to redevelop one LSI chip again in this case, a reduction in cost can also be achieved.

Incidentally, the various modifications and applications described in the present specification can be applied even to the configurations described in FIGS. 24 through 31.

The pull-down resistors and N channel MOS transistors employed in the circuits shown in the above-described embodiments, modifications and applications may be used as pull-up resistors and P channel MOS transistors according to the use of the potential level of the select signal SEL, respectively. Other signals may be used without limitations to the reset signal RES. However, the reset signal RES is suitable as one automatically set upon the initial operation of the LSI chip.

According to the semiconductor device of the present invention as described above, a system LSI can easily be implemented by a semiconductor device wherein a plurality of LSI chips are sealed with a resin.

According to the semiconductor device of the present invention as well, problems developed upon implementation of a system LSI by a semiconductor device wherein a plurality of LSI chips are sealed with a resin, can be solved. The system LSI can be implemented without impairing a function set as for the system LSI even as compared with the conventional one.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device wherein first and second semiconductor elements different in performance are sealed with a resin, comprising the following steps:

a step for determining the second semiconductor element, wherein one capable of implementing a desired function in cooperation with the first semiconductor element, of a plurality of semiconductor elements respectively having different performance, is selected as the second semiconductor element;

a step for electrically connecting the first and second semiconductor elements to each other, wherein said first semiconductor element has a plurality of first pad electrodes and a plurality of second pad electrodes placed over a main surface of said first semiconductor element, said first pad electrodes are used for electrically connecting to their corresponding ones of a plurality of terminals for connection to the outside, and electrical connections of said first semiconductor element to said second semiconductor element are carried out by using the plurality of second pad electrodes; and a step for sealing the first and second semiconductor elements electrically connected to each other with a resin.

2. The method according to claim 1, wherein either one of said first semiconductor element and said second semiconductor element applies a manufacturing method for using a first source voltage as a source voltage for operation, and the other thereof applies a manufacturing method for using a second source voltage lower than the first source voltage as a source voltage for operation.

3. The method according to claim 1, wherein either one of said first semiconductor element and said second semiconductor element applies a manufacturing method for fabricating an analog circuit and integrating the same therein, and the other thereof applies a manufacturing method for fabricating a logic circuit and integrating the same therein.

4. The method according to claim 1, wherein said first semiconductor element is stacked and placed over the main surface of said second semiconductor element.

5. The method according to claim 4, wherein said second semiconductor element is a memory, and said first semiconductor element is placed so as to cover an area in which memory cells of said semiconductor element are placed.

6. The method according to claim 5, wherein a size of said first semiconductor element is smaller than a size of said second semiconductor element.

7. The method according to claim 4, wherein a size of said first semiconductor element is smaller than a size of said second semiconductor element, and the second semiconductor element has a predetermined circuit having a characteristic that tends to change with stress, the first semiconductor element is placed on the second semiconductor element so that an edge of the first semiconductor element is not placed above the predetermined circuit.

8. The method according to claim 1, wherein said first semiconductor element has a mask ROM, and when a rewritable programmable memory used in a role similar to the mask ROM is used as said second semiconductor element, the use of the mask ROM is prohibited.

9. A method of manufacturing a semiconductor device wherein first and second semiconductor elements are sealed with a resin and a desired function is implemented by using the semiconductor elements, comprising the following steps of:

providing the remaining components necessary to implement the desired function except for some thereof so as to be capable of operation with respect to the first semiconductor element for the purpose of implementing the desired function;

providing the second semiconductor element with some components non-provided for the first semiconductor element; and electrically connecting the components between the semiconductor elements so as to allow the transfer of signals between these two semiconductor elements.

10. The method according to claim 9, wherein either one of said first semiconductor element and said second semiconductor element applies a manufacturing method for using a first source voltage as a source voltage for operation, and the other thereof applies a manufacturing method for using a second source voltage lower than the first source voltage as a source voltage for operation.

11. The method according to claim 9, wherein either one of said first semiconductor element and said second semiconductor element applies a manufacturing method for fabricating an analog circuit and integrating the same therein, and the other thereof applies a manufacturing method for fabricating a logic circuit and integrating the same therein.

12. The method according to claim 9, wherein said first semiconductor element is stacked and placed over the main surface of said second semiconductor element.

13. The method according to claim 12, wherein said second semiconductor element is a memory, and said first semiconductor element is placed so as to cover an area in which memory cells of said second semiconductor element are placed.

14. The method according to claim 13, wherein a size of said first semiconductor element is smaller than a size of said second semiconductor.

15. The method according to claim 12, wherein a size of said first semiconductor element is smaller than a size of said second semiconductor element, and the second semiconductor element has a predetermined circuit having a characteristic that tends to change with stress, the first semiconductor element is placed on the second semiconductor element so that an edge of the first semiconductor element is not placed above the predetermined circuit.

16. The method according to claim 9, wherein said first semiconductor element has a mask ROM, and when a rewritable programmable memory used in a role similar to the mask ROM is used as said second semiconductor element, the use of the mask ROM is prohibited.

17. A method of manufacturing a semiconductor device having first and second semiconductor elements, a size of said first semiconductor element is smaller than a size of said second semiconductor element, comprising the following steps:

placing said first semiconductor element on a main surface of said second semiconductor element so that an edge of the first semiconductor element is not placed above a predetermined circuit in said second semiconductor element, the first semiconductor element having a plurality of first electrodes and the second semiconductor element having a plurality of second electrodes for being electrically connected to the first electrodes and a plurality of third electrodes for being electrically connected to external connecting terminals;

electrically connecting each of the first electrodes of the first semiconductor element to corresponding ones of the second electrodes of the second semiconductor element, and electrically connecting each of the third electrodes of the second semiconductor element to corresponding ones of the external connecting terminals; and sealing the first and second semiconductor elements with resin so as to expose at least a part of each of said external connecting terminals.

18. The method according to claim 17, wherein said predetermined circuit has a characteristic that tends to change with stress.

19. The method according to claim 17, wherein said predetermined circuit is memory cell array.

\* \* \* \* \*